United States Patent
Nomura et al.

(10) Patent No.: US 10,374,575 B2
(45) Date of Patent: Aug. 6, 2019

(54) OSCILLATION MODULE, ELECTRONIC APPARATUS, AND VEHICLE

(71) Applicant: SEIKO EPSON CORPORATION, Tokyo (JP)

(72) Inventors: Masataka Nomura, Minowa-machi (JP); Shigeki Sasayama, Fujimi-machi (JP); Akira Nakada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 209 days.

(21) Appl. No.: 15/412,629

(22) Filed: Jan. 23, 2017

(65) Prior Publication Data

US 2017/0222623 A1    Aug. 3, 2017

(30) Foreign Application Priority Data

Feb. 2, 2016    (JP) .................. 2016-017718

(51) Int. Cl.
| | |
|---|---|
| *H03B 5/32* | (2006.01) |
| *H03B 5/36* | (2006.01) |
| *H03H 1/00* | (2006.01) |
| *H03H 7/06* | (2006.01) |
| *H03H 9/10* | (2006.01) |
| *H03H 9/64* | (2006.01) |
| *H03J 3/04* | (2006.01) |
| *H03J 3/18* | (2006.01) |
| *H03J 3/20* | (2006.01) |

(Continued)

(52) U.S. Cl.
CPC ........... *H03H 9/64* (2013.01); *H01F 17/0006* (2013.01); *H01L 21/44* (2013.01); *H01L 27/0248* (2013.01); *H03B 5/326* (2013.01); *H03B 5/364* (2013.01); *H03H 9/1064* (2013.01); *H03J 3/04* (2013.01); *H03J 3/185* (2013.01); *H03J 3/20* (2013.01); *H01F 2017/0026* (2013.01); *H03H 7/06* (2013.01); *H03H 2001/0085* (2013.01)

(58) Field of Classification Search
CPC . H03L 1/00; H03L 1/026; H03L 7/099; H03L 1/028; H03L 1/04; H03L 7/085; H03L 7/091; H03L 7/095; H03L 1/022; H03L 1/023; H03H 9/64; H03H 9/1064; H03H 7/06; H03H 2001/0085; H03J 3/185; H03J 3/20; H03J 3/04; H01L 21/44; H01L 27/0248; H03B 5/326; H03B 5/364
USPC .................. 331/107 A, 167, 177 V, 117 FE; 333/185; 438/458, 381, 238; 257/508, 257/484; 336/200, 232
See application file for complete search history.

(56) References Cited

U.S. PATENT DOCUMENTS 8,884,713 B2 * 11/2014 Tham .................. H03B 1/04
                                                 331/117 FE
2004/0238857 A1 * 12/2004 Beroz ................ H01F 17/0033
                                                 257/232

(Continued)

FOREIGN PATENT DOCUMENTS

| JP | 2004-040509 A | 2/2004 |
| JP | 2007-013565 A | 1/2007 |

*Primary Examiner* — Arnold M Kinkead
(74) *Attorney, Agent, or Firm* — Oliff PLC

(57) ABSTRACT

An oscillation module includes an SAW filter, and a high-pass filter formed in an integrated circuit, the high-pass filter has a coil part, a capacitance part, and a first interconnection adapted to connect the coil part and the capacitance part to each other, and the capacitance part includes a capacitance array.

17 Claims, 11 Drawing Sheets

(51) Int. Cl.
*H01F 17/00* (2006.01)
*H01L 21/44* (2006.01)
*H01L 27/02* (2006.01)

(56) References Cited

U.S. PATENT DOCUMENTS

2007/0001771 A1 1/2007 Hori et al.
2016/0294367 A1* 10/2016 Bao ..................... H03H 19/004

* cited by examiner

OSCILLATION MODULE, ELECTRONIC APPARATUS, AND VEHICLE

BACKGROUND

1. Technical Field

The present invention relates to an oscillation module, and an electronic apparatus and a vehicle each equipped with the oscillation module.

2. Related Art

In JP-A-2004-040509 (Document 1), there is disclosed an oscillation circuit constituted by an oscillating differential amplifier formed of an ECL line receiver, a differential amplifier for a feedback buffer, which is formed of an ECL line receiver, and has an output terminal terminated with an emitter termination resistance, a switch circuit, a voltage-controlled phase-shift circuit, an SAW resonator, and an impedance circuit, and in the oscillation circuit, there is formed a positive feedback oscillation loop constituted by at least the oscillating differential amplifier, the differential amplifier for the feedback buffer, the voltage-controlled phase-shift circuit, and the SAW resonator. According to the oscillation circuit, by varying the emitter termination resistance of the differential amplifier for the feedback buffer to increase the drive level of the SAW resonator, the amplitude of a signal from the SAW resonator becomes relatively larger compared to the noise to be superimposed on that signal. In other words, since the high SN ratio can be achieved, the jitter due to the noise superimposed on the signal from the SAW resonator can be reduced.

Although the oscillator circuit outputs the oscillation signal with a frequency in the vicinity of the resonance frequency of the SAW resonator, it is also possible to oscillate a signal with a frequency N times of the resonance frequency by providing a multiplier circuit in the posterior stage. In, for example, JP-A-2007-013565 (Document 2), there is disclosed an oscillation circuit having a multiplier circuit disposed in the posterior stage of a ring oscillator. The multiplier circuit has a configuration of outputting an exclusive OR of two signals taken out from any two stages of inverters out of odd number of stages of inverters constituting the ring oscillator, and if, for example, the multiplier circuit described in Document 2 is disposed in the posterior stage of the oscillator circuit described in Document 1, it is possible to obtain a multiplied output while suppressing an increase in the circuit area.

The oscillation circuit has a configuration of outputting the oscillation signal with the frequency in the vicinity of the resonance frequency of the SAW resonator and the oscillation signal with the frequency obtained by multiplying the frequency in the vicinity of the resonance frequency of the SAW resonator, but has a room for improvement regarding the change in the frequency band of the oscillation frequency using the master slice.

SUMMARY

An advantage of some aspects of the invention is to solve at least a part of the problems described above, and the can be implemented as the following forms or the application examples.

APPLICATION EXAMPLE 1

An oscillation module according to this application example of the invention includes an SAW filter, and a high-pass filter formed in an integrated circuit, the high-pass filter has a coil part, a capacitance part, and a first interconnection adapted to connect the coil part and the capacitance part to each other, and the capacitance part includes a capacitance array.

According to this configuration, since the oscillation module is provided with the SAW filter and the high-pass filter, the high-pass filter has the coil part and the capacitance part, and the capacitance part includes the capacitance array (an aggregate of capacitances (e.g., capacitors) arranged; a capacitance group), by selecting the capacitance in the capacitance array of the capacitance part, a desired frequency band can be set as the passband of the high-pass filter.

Thus, even if the oscillation frequency changes due to the change of the SAW filter, the oscillation module can deal with the change only by the adjustment (e.g., change of the wiring layer mask) of the capacitance array of the high-pass filter.

As a result, it becomes possible for the oscillation module to achieve shortening of turnaround time and reduction in cost with respect to the change (serialization of the oscillation frequency) in frequency band of the oscillation signal using the master slice.

APPLICATION EXAMPLE 2

In the oscillation module according to the application example described above, it is preferable that the coil part is disposed in a second wiring layer thicker than a first wiring layer in which the first interconnection is disposed.

According to this configuration, in the oscillation module, since the coil part is disposed in the second wiring layer thicker than the first wiring layer in which the first interconnection is disposed, a variation in inductance of the coil part can be suppressed.

APPLICATION EXAMPLE 3

In the oscillation module according to the application example described above, it is preferable that the second wiring layer is stacked above the first wiring layer.

According to this configuration, in the oscillation module, since the second wiring layer is stacked above the first wiring layer, it is possible to form the capacitance part with the second wiring layer and the first wiring layer.

APPLICATION EXAMPLE 4

In the oscillation module according to the application example described above, it is preferable that the capacitance array includes a first capacitance, and at least one electrode of the first capacitance is disposed in a first wiring layer in which the first interconnection is disposed.

According to this configuration, in the oscillation module, since the capacitance array includes the first capacitance, and at least one electrode of the first capacitance is disposed in the first wiring layer, it is possible to use a part of the first interconnection as the one electrode of the first capacitance.

APPLICATION EXAMPLE 5

In the oscillation module according to the application example described above, it is preferable that the other electrode of the first capacitance is disposed so as to straddle a second wiring layer and a third wiring layer, and the second wiring layer and the third wiring layer are configured so as to sandwich the first wiring layer in which the one electrode is disposed.

According to this configuration, in the oscillation module, since the other electrode of the first capacitance is disposed so as to straddle the second wiring layer and the third wiring layer, and is configured so that the first wiring layer is sandwiched by the second wiring layer and the third wiring layer, the desired capacitance value can be obtained with a smaller plane area compared to other configurations.

APPLICATION EXAMPLE 6

In the oscillation module according to the application example described above, it is preferable that there are further included a first terminal connected to the coil part, and a second terminal connected to an outside of the high-pass filter, the first interconnection electrically connects the one electrode and the first terminal to each other, and a second interconnection disposed in the second wiring layer and a third interconnection disposed in the third wiring layer electrically connect the other electrode and the second terminal to each other.

According to this configuration, in the oscillation module, since the first interconnection electrically connects the one electrode of the first capacitance and the first terminal to each other, and the second interconnection and the third interconnection electrically connect the other electrode of the first capacitance and the second terminal to each other, the frequency band corresponding to the first capacitance can be set as the passband of the high-pass filter.

Thus, even if the oscillation frequency changes due to the change of the SAW filter, the oscillation module can deal with the change only by the adjustment of the capacitance array of the high-pass filter.

APPLICATION EXAMPLE 7

In the oscillation module according to the application example described above, it is preferable that the capacitance array further includes a second capacitance, and one electrode of the second capacitance is connected to the one electrode of the first capacitance with the first interconnection.

According to this configuration, in the oscillation module, since the capacitance array further includes the second capacitance, and the one electrode of the second capacitance is connected to the one electrode of the first capacitance with the first interconnection, the frequency band corresponding to the sum of the capacitance value of the first capacitance and the capacitance value of the second capacitance can be set as the passband of the high-pass filter.

Thus, even if the oscillation frequency changes due to the change of the SAW filter, the oscillation module can deal with the change only by the adjustment of the capacitance array of the high-pass filter, and the range of the change which can be dealt with can be increased compared to the case only with the first capacitance.

APPLICATION EXAMPLE 8

In the oscillation module according to the application example described above, it is preferable that a capacitance value of the first capacitance and a capacitance value of the second capacitance are roughly equal to each other.

According to this configuration, in the oscillation module 1, since the capacitance value of the first capacitance and the capacitance value of the second capacitance are roughly equal to each other, for example, by copying and pasting the design data of the first capacitance, the layout design of the integrated circuit becomes easy.

APPLICATION EXAMPLE 9

In the oscillation module according to the application example described above, it is preferable that a capacitance value of the second capacitance is higher than a capacitance value of the first capacitance.

According to this configuration, in the oscillation module, in the case in which the capacitance value of the second capacitance is higher than the capacitance value of the first capacitance, the range of the change which can be dealt with to the change in the oscillation frequency due to the change of the SAW filter can be increased compared to the case in which the capacitance value of the first capacitance and the capacitance value of the second capacitance are roughly equal to each other.

APPLICATION EXAMPLE 10

In the oscillation module according to the application example described above, it is preferable that a wiring length of the first interconnection from the first terminal to the first capacitance is shorter than a wiring length of the first interconnection from the first terminal to the second capacitance.

According to this configuration, in the oscillation module, since the wiring length of the first interconnection from the first terminal to the first capacitance is shorter than the wiring length of the first interconnection from the first terminal to the second capacitance, it is possible to reduce the variation in impedance and the variation in parasitic capacitance due to the wiring length of the first interconnection, the influence of which becomes greater as the capacitance value of the first capacitance decreases.

Thus, it is possible for the oscillation module to output the oscillation signal high in frequency accuracy.

APPLICATION EXAMPLE 11

In the oscillation module according to the application example described above, it is preferable that the capacitance array further includes a third capacitance, and one electrode of the third capacitance is connected to the one electrode of the first capacitance and the one electrode of the second capacitance with the first interconnection.

According to this configuration, in the oscillation module, since the capacitance array further includes the third capacitance, and the one electrode of the third capacitance is connected to the one electrode of the first capacitance and the one electrode of the second capacitance with the first interconnection, the frequency band corresponding to the sum of the capacitance value of the first capacitance, the capacitance value of the second capacitance, and the capacitance value of the third capacitance can be set as the passband of the high-pass filter.

Thus, even if the oscillation frequency changes due to the change of the SAW filter, the oscillation module can deal with the change only by the adjustment of the capacitance array of the high-pass filter, and the range of the change which can be dealt with can be increased compared to the case only with the first capacitance and the second capacitance.

APPLICATION EXAMPLE 12

An oscillation module according to this application example of the invention includes an SAW filter, and a high-pass filter formed in an integrated circuit, the high-pass filter includes a coil part and a capacitance part including a capacitance array, the capacitance array includes a first terminal connected to the coil part, a first capacitance, and a second capacitance, a capacitance value of the first capacitance is lower than a capacitance value of the second capacitance, and a wiring length in a case in which the first capacitance and the first terminal are connected to each other is shorter than a wiring length in a case in which the second capacitance and the first terminal are connected to each other.

According to this configuration, in the oscillation module, since the capacitance value of the first capacitance in the capacitance array is lower than the capacitance value of the second capacitance, and the wiring length in the case in which the first capacitance and the first terminal are connected to each other is shorter than the wiring length in the case in which the second capacitance and the first terminal are connected to each other, it is possible to reduce the variation in impedance and the variation in parasitic capacitance due to the wiring length, the influence of which becomes greater as the capacitance value of the first capacitance decreases.

Thus, it is possible for the oscillation module to output the oscillation signal high in frequency accuracy.

APPLICATION EXAMPLE 13

An oscillation module according to this application example of the invention includes an SAW filter, and a high-pass filter formed in an integrated circuit, the high-pass filter includes a coil part and a capacitance part including a capacitance array, the capacitance array includes a first terminal connected to the coil part, a first capacitance, a second capacitance, and a third capacitance, a sum of a capacitance value of the first capacitance and a capacitance value of the second capacitance is lower than a capacitance value of the third capacitance, and a wiring length in a case in which the first capacitance is connected to the first terminal is shorter than a wiring length in a case in which the third capacitance is connected to the first terminal.

According to this configuration, in the oscillation module, since the sum of the capacitance value of the first capacitance and the capacitance value of the second capacitance in the capacitance array is lower than the capacitance value of the third capacitance, and the wiring length in the case in which the first capacitance is connected to the first terminal is shorter than the wiring length in the case in which the third capacitance is connected to the first terminal, it is possible to reduce the variation in impedance and the variation in parasitic capacitance due to the wiring length, the influence of which becomes greater as the capacitance value of the first capacitance decreases.

Thus, it is possible for the oscillation module to output the oscillation signal high in frequency accuracy.

APPLICATION EXAMPLE 14

An oscillation module according to this application example of the invention includes an SAW filter, and a high-pass filter formed in an integrated circuit, the high-pass filter includes a coil part and a capacitance part including a capacitance array, the capacitance array includes a first terminal connected to the coil part, a first array of n capacitances connected to each other, and a second array of m capacitances connected to each other, a total capacitance value of the first array is lower than a total capacitance value of the second array, and a wiring length in a case in which one of the capacitances belonging to the first array and the first terminal are connected to each other is shorter than a wiring length in a case in which one of the capacitances belonging to the second array and the first terminal are connected to each other.

According to this configuration, in the oscillation module, since the total capacitance value of the first array in the capacitance array is lower than the total capacitance value of the second array, and the wiring length in the case in which one of the capacitances belonging to the first array and the first terminal are connected to each other is shorter than the wiring length in the case in which one of the capacitances belonging to the second array and the first terminal are connected to each other, it is possible to reduce the variation in impedance and the variation in parasitic capacitance due to the wiring length, the influence of which becomes greater as the total capacitance value of the first array decreases.

Thus, it is possible for the oscillation module to output the oscillation signal high in frequency accuracy.

APPLICATION EXAMPLE 15

An electronic apparatus according to this application example includes the oscillation module according to any one of the application examples described above.

According to this configuration, since the electronic apparatus is provided with the oscillation module according to any one of the application examples described above, the advantages described in the application example are provided, and the excellent performance can be exerted.

APPLICATION EXAMPLE 16

A vehicle according to this application example includes the oscillation module according to any one of the application examples described above.

According to this configuration, since the vehicle is provided with the oscillation module according to any one of the application examples described above, the advantages described in the application example are provided, and the excellent performance can be exerted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some preferred embodiments of the invention will hereinafter be described in detail using the accompanying drawings. It should be noted that the embodiments described below do not unreasonably limit the content of the invention as set forth in the appended claims. Further, all of the constituents described below are not necessarily essential elements of the invention.

1. Oscillation Module 1-1. Structure of Oscillation Module

Figure 1:
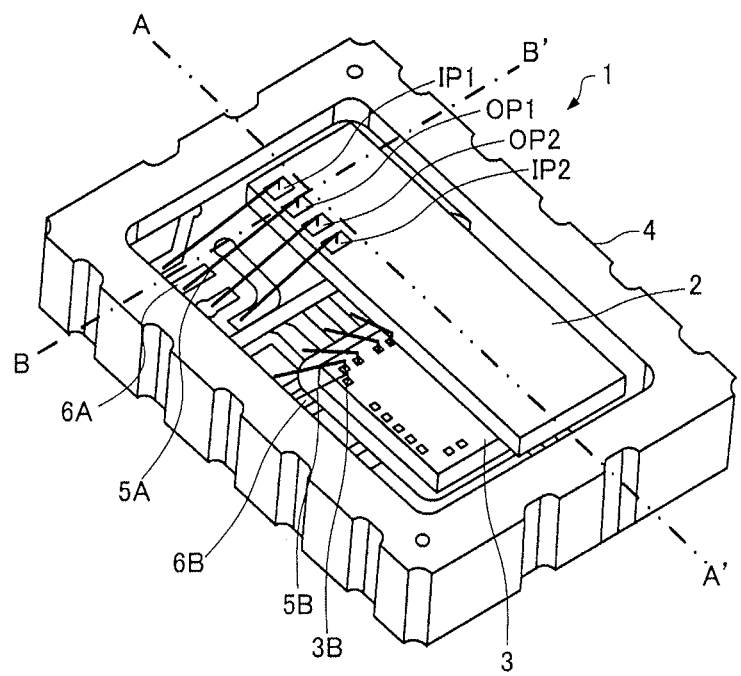
FIG. 1 is a perspective view of an oscillation module according to an embodiment of the invention.
Figure 2:
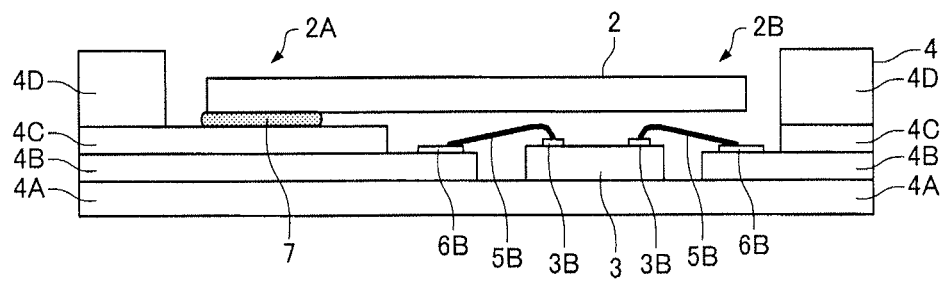
FIG. 2 is a cross-sectional view of the oscillation module cut along the line A-A' shown in FIG. 1.
Figure 3:
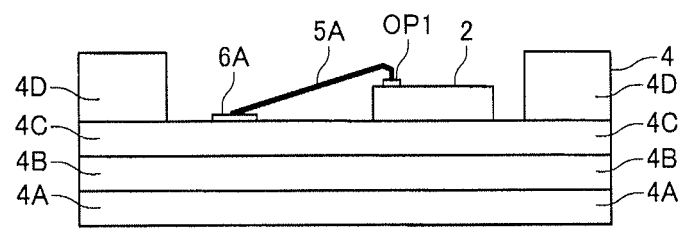
FIG. 3 is a cross-sectional view of the oscillation module cut along the line B-B' shown in FIG. 1.

FIG. 1 is a diagram showing an example of a structure of an oscillation module according to the present embodiment, and is a perspective view of the oscillation module. Further, FIG. 2 is a cross-sectional view of the oscillation module cut along the line A-A' shown in FIG. 1, and FIG. 3 is a cross-sectional view of the oscillation module cut along the line B-B' shown in FIG. 1. It should be noted that although in FIG. 1 through FIG. 3, there is illustrated the oscillation module 1 in the state in which a lid is removed, in reality, the oscillation module is constituted with an opening of a package 4 covered with the lid not shown.

As shown in FIG. 1, the oscillation module 1 according to the present embodiment is configured including an SAW (surface acoustic wave) filter (a surface acoustic wave filter) 2, an integrated circuit (IC) 3, and a package 4.

The package 4 is a stacked package such as a ceramic package, and houses the SAW filter 2 and the integrated circuit 3 in the same space. Specifically, an opening part is provided in an upper part of the package 4, a housing chamber is formed by covering the opening part with the lid not shown, and the SAW filter 2 and the integrated circuit 3 are housed in the housing chamber.

As shown in FIG. 2, the lower surface of the integrated circuit 3 is bonded and fixed to the upper surface of a first layer 4A of the package 4. Further, electrodes (pads) 3B disposed on the upper surface of the integrated circuit 3 and electrodes 6B disposed on the upper surface of the second layer 4B of the package 4 are respectively bonded to each other with wires 5B.

One of the end parts of the SAW filter 2 is fixed firmly to the package 4. More specifically, the lower surface of one (a first end part) 2A of the end parts in the longitudinal direction of the SAW filter 2 is bonded and fixed to the upper surface of a third layer 4C of the package 4 with an adhesive 7. Further, the other (a second end part) 2B of the end parts in the longitudinal direction of the SAW filter 2 is not fixed, and further, there is disposed a gap between the second end part 2B and an inner surface of the package 4. In other words, the SAW filter 2 is fixed to the package 4 to form a cantilever structure.

It should be noted that there is adopted a configuration in which a fourth layer 4D of the package 4 is disposed in the outer periphery of the upper surface of the third layer 4C of the package 4, and the lid not shown is bonded on the upper surface of the fourth layer 4D.

As shown in FIG. 1, on the upper surface of the SAW filter 2, there are disposed four electrodes (also referred to as bonding terminals) respectively functioning as a first input port IP1, a second input port IP2, a first output port OP1, and a second output port OP2 in the first end part 2A. Further, as shown in FIG. 1 and FIG. 3, the first input port IP1, the second input port IP2, the first output port OP1, and the second output port OP2 of the SAW filter 2 and four electrodes 6A disposed on the upper surface of the third layer 4C of the package 4 are respectively bonded to each other with wires 5A.

Inside the package 4, there are disposed interconnections not shown for electrically connecting the four electrodes 6A and the predetermined four electrodes 6B respectively to each other. Specifically, the first input port IP1, the second input port IP2, the first output port OP1, and the second output OP2 of the SAW filter 2 are respectively connected to the four electrodes (pads) 3B of the integrated circuit 3 different from each other via the wires 5A, the wires 5B, and the internal interconnections of the package 4.

Further, on the surface (outer surface) of the package 4, there is disposed a plurality of external electrodes not shown functioning as power supply terminals, ground terminals, or output terminals, and inside the package 4, there are also disposed interconnections not shown for electrically connecting the external electrodes and the predetermined electrodes 6B respectively to each other.

Figure 4:
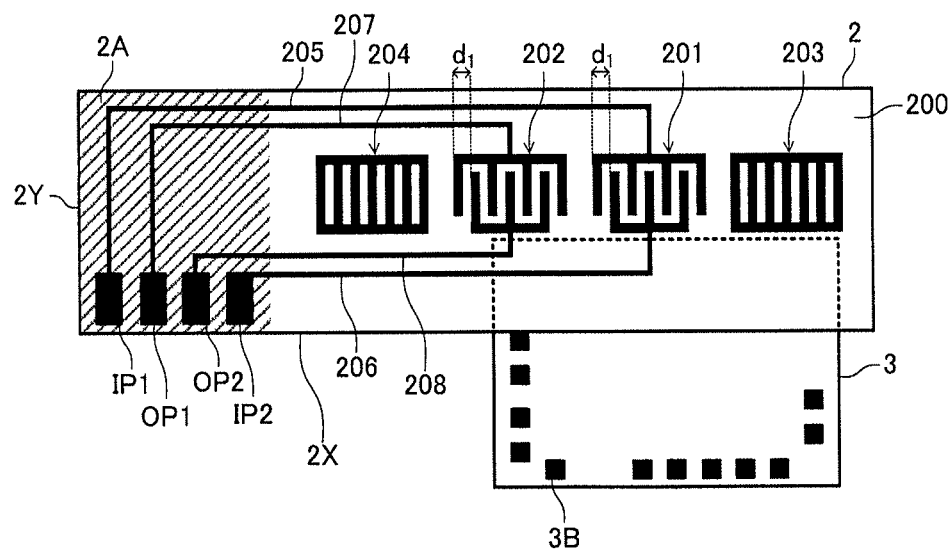
FIG. 4 is a plan view of an SAW filter and an integrated circuit.

FIG. 4 is a plan view of the SAW filter and the integrated circuit when viewing the oscillation module shown in FIG. 1 from the upper surface thereof.

As shown in FIG. 4, the SAW filter 2 has a first interdigital transducer (IDT) 201, a second IDT 202, a first reflector 203, and a second reflector 204 disposed on the surface of the piezoelectric substrate 200.

The piezoelectric substrate 200 can be manufactured using a single-crystal material such as a quartz crystal, a lithium niobate ($LiNbO_3$), a lithium tantalate ($LiTaO_3$), or a lithium tetraborate ($Li_2B_4O_7$, LBO), a piezoelectric thin film made of a zinc oxide (ZnO), an aluminum nitride (AlN), or the like, or a piezoelectric ceramic material.

The first IDT 201 and the second IDT 202 are located between the first reflector 203 and the second reflector 204, and each have two electrodes, each of which has a plurality of electrode fingers disposed at regular intervals, and which are arranged so that the electrode fingers interdigitate with each other. Further, as shown in FIG. 4, the electrode finger pitches of the first IDT 201 and the second IDT 202 are both set to a constant value $d_1$.

Further, the SAW filter 2 has the first input port IP1 connected to the first IDT 201, the second input port IP2 connected to the first IDT 201, the first output port OP1 connected to the second IDT 202, and the second output port OP2 connected to the second IDT 202, disposed on the surface of the piezoelectric substrate 200.

Specifically, on the surface of the piezoelectric substrate 200, there are disposed a first interconnection 205 and a second interconnection 206, the first input port IP1 is connected to one (upper one in FIG. 4) of the electrodes of the first IDT 201 with the first interconnection 205, and the second input port IP2 is connected to the other (lower one in FIG. 4) of the electrodes of the first IDT 201 with the second interconnection 206. Further, on the surface of the piezoelectric substrate 200, there are disposed a third interconnection 207 and a fourth interconnection 208, the first output port OP1 is connected to one (upper one in FIG. 4) of the electrodes of the second IDT 202 with the third interconnection 207, and the second output port OP2 is connected to the other (lower one in FIG. 4) of the electrodes of the second IDT 202 with the fourth interconnection 208.

In the SAW filter 2 configured in such a manner, when an electrical signal having a frequency in the vicinity of $f=v/(2d_1)$ (v denotes the speed of the surface acoustic wave propagating on the surface of the piezoelectric substrate 200) is input from the first input port IP1 and the second input port IP2, a surface acoustic wave having a wavelength equal to $2d_1$ is excited by the first IDT 201. Then, the surface acoustic wave thus excited by the first IDT 201 is reflected between the first reflector 203 and the second reflector 204 to turn to a standing wave. The standing wave is converted in the second IDT 202 into an electrical signal, and is output from the first output port OP1 and the second output port OP2. In other words, the SAW filter 2 functions as a narrow-band band-pass filter with a center frequency of $f=v/(2d_1)$.

In the present embodiment, as shown in FIG. 4, at least a part of the SAW filter 2 overlaps the integrated circuit 3 in a planar view. Further, in the planar view, the first end part 2A (the part with hatching in FIG. 4) of the SAW filter 2 does not overlap the integrated circuit 3. As described above, in the present embodiment, by fixing the first end part 2A of the SAW filter 2 to the package 4 to cantilever the SAW filter 2, and disposing the integrated circuit 3 in the space formed below the SAW filter 2, miniaturization of the oscillation module 1 is realized.

Further, according to the oscillation module 1 of the present embodiment, since the first end part 2A, which is a part of the surface of the SAW filter 2, is fixed firmly to the package 4 instead of the entire surface of the SAW filter 2, the area of the part fixed firmly is small, and thus the part easily deformable by the stress applied by the package is small. Therefore, according to the oscillation module 1 of the present embodiment, the deterioration of the oscillation signal due to the stress applied to the SAW filter 2 can be reduced.

Further, since the reverse surface of the piezoelectric substrate 200 in the first end part 2A of the SAW filter 2 is fixed to the package 4 with the adhesive 7, the first end part 2A is easily deformed due to shrinkage of the adhesive 7. Therefore, in the present embodiment, as shown in FIG. 4, the first IDT 201, the second IDT 202, the first reflector 203, and the second reflector 204 are not disposed on the surface of the piezoelectric substrate 200 in the first end part 2A. Thus, the deformation of the first IDT 201 and the second IDT 202 is significantly reduced. Therefore, according to the present embodiment, since it is possible to reduce the error of the electrode finger pitch $d_1$ with respect to a target value caused by the deformation of the first IDT 201 and the second IDT 202 due to the stress by the shrinkage of the adhesive 7, the oscillation module 1 high in frequency accuracy can be realized.

Further, in the present embodiment, by cantilevering the SAW filter 2, the stress due to the contact with the package 4 is not applied to the second end part 2B, which is a free end. Therefore, according to the present embodiment, since the deformation of the first IDT 201 and the second IDT 202 caused by the stress due to the contact with the package 4 does not occur, it is possible to realize the oscillation module 1 high in frequency accuracy.

Further, in the present embodiment, the first input port IP1, the second input port IP2, the first output port OP1, and the second output port OP2, which are not changed in characteristics by the deformation, are disposed on the surface of the piezoelectric substrate 200 in the first end part 2A of the SAW filter 2. Thus, the SAW filter 2 is prevented from becoming unnecessarily large, and thus the miniaturization of the oscillation module 1 is made possible.

Further, in the present embodiment, as shown in FIG. 4, the SAW filter 2 has a rectangular shape having long sides 2X and short sides 2Y, and the first input port IP1, the second input port IP2, the first output port OP1, and the second output port OP2 are arranged along the long side 2X of the SAW filter 2 in the planar view. Therefore, according to the present embodiment, since all of the four wires 5A connected respectively to the first input port IP1, the second input port IP2, the first output port OP1, and the second output port OP2 can be disposed around the long side 2X in the outside of the SAW filter 2 as shown in FIG. 1, it is possible to efficiently use the space around the long side of the SAW filter 2 in the inside of the package 4 to thereby decrease the space around the short side. Therefore, the oscillation module 1 can be miniaturized.

Further, in the present embodiment, as shown in FIG. 4, the first input port IP1 and the second input port IP2 are arranged with distances equal to each other from the long side 2X, and the first output port OP1 and the second output port OP2 are arranged with distances equal to each other from the long side 2X in the planar view. Therefore, according to the present embodiment, it is possible to make the length of the interconnection (the wire 5A and the substrate interconnection) connected to the first input port IP1 and the length of the interconnection connected to the second input port IP2 easy to uniform, to make the length of the interconnection connected to the first output port OP1 and the length of the interconnection connected to the second output port OP2 easy to uniform, and to reduce the phase difference of the differential signal input to or output from the SAW filter 2.

Further, in the present embodiment, as shown in FIG. 4, the first input port IP1, the second input port IP2, the first output port OP1, and the second output port OP2 are arranged with distances equal to each other from the long side 2X in the planar view. Therefore, it is easy to uniform the heights of the four wires 5A connected respectively to the first input port IP1, the second input port IP2, the first output port OP1, and the second output port OP2.

Figure 5:
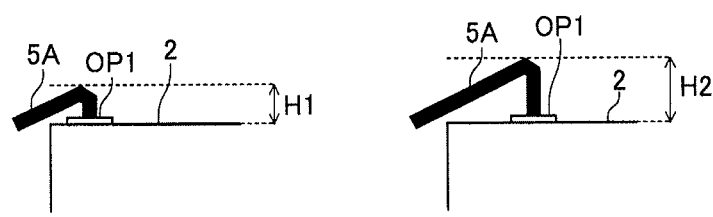
FIG. 5 is a diagram showing a bonding terminal part of the oscillation module according to the embodiment.

In particular, in the present embodiment, since the first input port IP1, the second input port IP2, the first output port OP1, and the second output port OP2 are disposed along the long side 2X at positions close to the long side 2X, the height $H_1$ of the highest part of each of the wires 5A from the upper surface of the SAW filter 2 can be decreased as shown in the cross-sectional view (the cross-sectional view illustrating a part of FIG. 3) on the left side of FIG. 5. On the right side of FIG. 5, there is shown a cross-sectional view in the case in which the first input port IP1, the second input port IP2, the first output port OP1, and the second output port OP2 are supposedly disposed at positions further from the long side 2X, and the height H2 of the highest part of each of the wires 5A from the upper surface of the SAW filter 2 is larger than the height H1. As described above, according to the present embodiment, since the wires 5A can be lowered, it becomes possible to reduce the size in the height direction of the package 4, and thus, the miniaturization of the oscillation module 1 can be realized.

Further, in the present embodiment, as shown in FIG. 4, the first input port IP1, the first output port OP1, the second output port OP2, and the second input port IP2 are arranged in the direction along the long side 2X in this order in the planar view. Thus, in the case of arranging the first IDT 201 and the second IDT 202 in the direction along the long side 2X, it becomes easy to dispose the first interconnection 205, the second interconnection 206, the third interconnection 207, and the fourth interconnection 208 without crossing each other, and the lengths of the interconnections can be shortened.

It should be noted that the configuration of the SAW filter 2 is not limited to the configuration shown in FIG. 4, but can also be, for example, a transversal SAW filter in which the reflectors are not provided, and the surface acoustic wave propagates between the IDT for input and the IDT for output.

1-2. Functional Configuration of Oscillation Module

Figure 6:
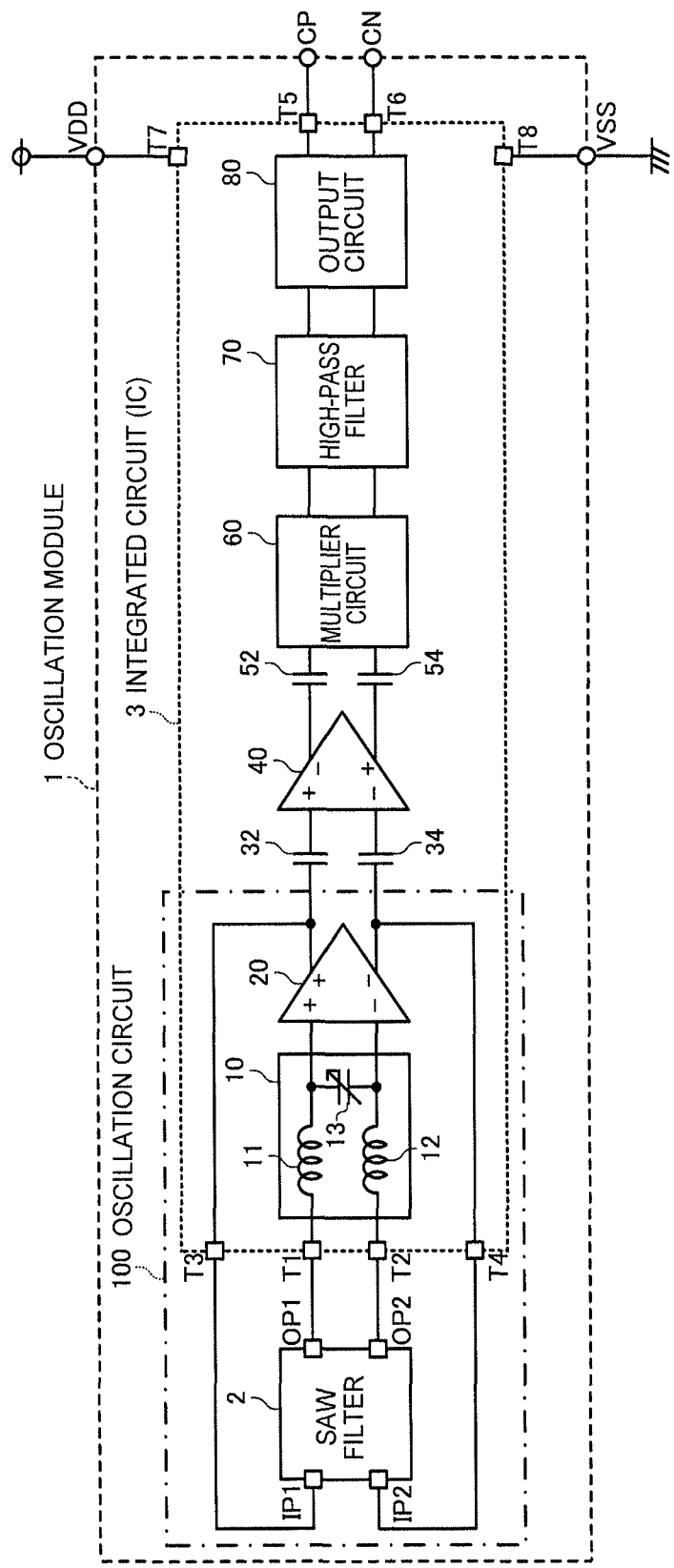
FIG. 6 is a block diagram showing an example of a functional configuration of the oscillation module according to the embodiment.

FIG. 6 is a block diagram showing an example of a functional configuration of the oscillation module according to the present embodiment. As shown in FIG. 6, the oscillation module 1 according to the present embodiment is configured including the SAW filter 2, a phase shift circuit 10, a differential amplifier 20, a capacitor 32, a capacitor 34, a differential amplifier 40, a capacitor 52, a capacitor 54, a multiplier circuit 60, a high-pass filter 70 (a filter circuit), and an output circuit 80. It should be noted that the oscillation module 1 according to the present embodiment can be provided with a configuration obtained by arbitrarily eliminating or modifying some of these constituents, or adding other constituents.

The phase shift circuit 10, the differential amplifier 20, the capacitor 32, the capacitor 34, the differential amplifier 40, the capacitor 52, the capacitor 54, the multiplier circuit 60, the high-pass filter 70, and the output circuit 80 are included in the integrated circuit 3. In other words, each of these circuits is a part of the integrated circuit 3.

The first output port OP1 of the SAW filter 2 is connected to an input terminal T1 of the integrated circuit 3. Further, the second output port OP2 of the SAW filter 2 is connected to an input terminal T2 of the integrated circuit 3. Further, the first input port IP1 of the SAW filter 2 is connected to an output terminal T3 of the integrated circuit 3. Further, the second input port IP2 of the SAW filter 2 is connected to an output terminal T4 of the integrated circuit 3.

A power supply terminal T7 of the integrated circuit 3 is connected to a VDD terminal, which is the external terminal (the external terminal disposed on the surface of the package 4) of the oscillation module 1, and a desired power supply potential is supplied to the power supply terminal T7 via the VDD terminal. Further, a ground terminal T8 of the integrated circuit 3 is connected to a VSS terminal, which is the external terminal of the oscillation module 1, and a ground potential (0V) is supplied to the ground terminal 18 via the VSS terminal. Further, the phase shift circuit 10, the differential amplifier 20, the capacitor 32, the capacitor 34, the differential amplifier 40, the capacitor 52, the capacitor 54, the multiplier circuit 60, the high-pass filter 70, and the output circuit 80 operate using the potential difference between the power supply terminal T7 and the ground terminal T8 as a power supply voltage. It should be noted that the power supply terminals and the ground terminals of the differential amplifier 20, the differential amplifier 40, the multiplier circuit 60, the high-pass filter 70, and the output circuit 80 are connected respectively to the power supply terminal T7 and the ground terminal T8, but are omitted from the illustration in FIG. 6.

The phase shift circuit 10 and the differential amplifier 20 are disposed on feedback paths from the first output port OP1 and the second output port OP2 to the first input port IP1 and the second input port IP2 of the SAW filter 2.

The phase shift circuit 10 has a coil 11, a coil 12, and a variable-capacitance element 13. The inductance of the coil 11 and the inductance of the coil 12 are the same (a difference due to the manufacturing tolerance is allowed) or can also be comparable with each other.

One end of the coil 11 is connected to the input terminal T1 of the integrated circuit 3, and the other end of the coil 11 is connected to one end of the variable-capacitance element 13 and a non-inverting input terminal of the differential amplifier 20. Further, one end of the coil 12 is connected to the input terminal T2 of the integrated circuit 3, and the other end of the coil 12 is connected to the other end of the variable-capacitance element 13 and an inverting input terminal of the differential amplifier 20.

The variable-capacitance element 13 can be, for example, a varactor (also referred to as a varicap or a variable-capacitance diode) varying in capacitance value in accordance with a voltage applied, or can also be a circuit, which includes a plurality of capacitors and a plurality of switches for selecting at least a part of the plurality of capacitors, and the capacitance value of which is changed in accordance with the capacitors selected by opening or closing the switches in accordance with selection signals.

The differential amplifier 20 amplifies the potential difference between a pair of signals input to the non-inverting input terminal and the inverting input terminal, and then outputs the result from a non-inverted output terminal and an inverted output terminal. The non-inverted output terminal of the differential amplifier 20 is connected to the output terminal T3 of the integrated circuit 3 and one end of the capacitor 32. Further, the inverted output terminal of the differential amplifier 20 is connected to the output terminal T4 of the integrated circuit 3 and one end of the capacitor 34.

Figure 7:
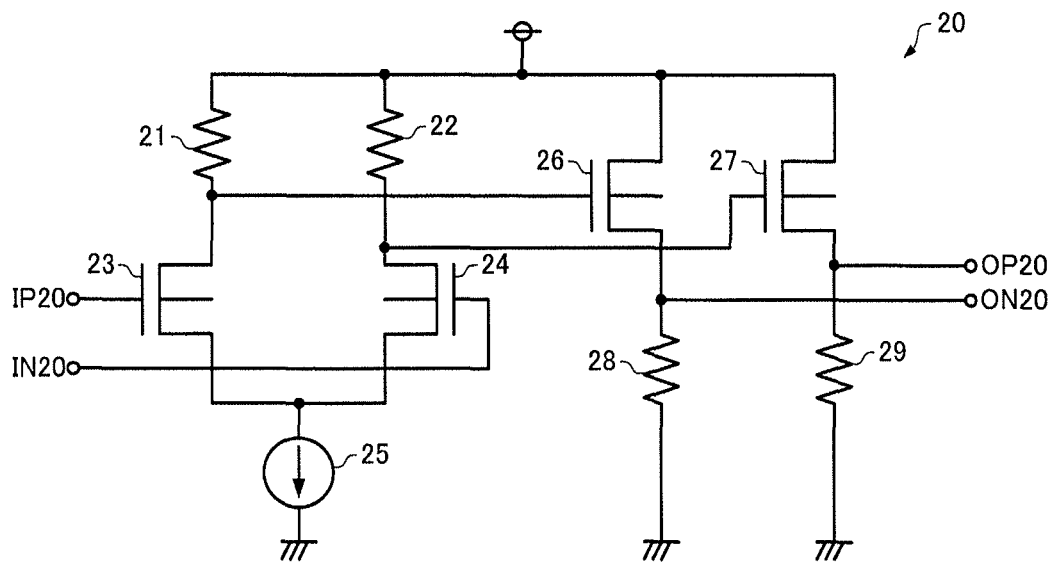
FIG. 7 is a diagram showing an example of a circuit configuration of a differential amplifier.

FIG. 7 is a diagram showing an example of a circuit configuration of the differential amplifier. In the example shown in FIG. 7, the differential amplifier 20 is configured including a resistor 21, a resistor 22, an NMOS (N-channel metal oxide semiconductor) transistor 23, an NMOS transistor 24, a constant current source 25, an NMOS transistor 26, an NMOS transistor 27, a resistor 28, and a resistor 29. In FIG. 7, for example, an input terminal IP20 is a non-inverting input terminal, and an input terminal IN20 is an inverting input terminal. Further, an output terminal OP20 is a non-inverted output terminal, and an output terminal ON20 is an inverted output terminal.

In the NMOS transistor 23, the gate terminal is connected to the input terminal IP20, the source terminal is connected to one end of the constant current source 25, and the drain terminal is connected to the power supply terminal T7 (see FIG. 6) via the resistor 21.

In the NMOS transistor 24, the gate terminal is connected to the input terminal IN20, the source terminal is connected to the one end of the constant current source 25, and the drain terminal is connected to the power supply terminal T7 (see FIG. 6) via the resistor 22.

The other end of the constant current source 25 is connected to the ground terminal T8 (see FIG. 6).

In the NMOS transistor 26, the gate terminal is connected to the drain terminal of the NMOS transistor 23, the source terminal is connected to the ground terminal T8 (see FIG. 6) via the resistor 28, and the drain terminal is connected to the power supply terminal T7 (see FIG. 6).

In the NMOS transistor 27, the gate terminal is connected to the drain terminal of the NMOS transistor 24, the source terminal is connected to the ground terminal T8 (see FIG. 6) via the resistor 29, and the drain terminal is connected to the power supply terminal T7 (see FIG. 6).

Further, the source terminal of the NMOS transistor 26 is connected to the output terminal ON20, and the source terminal of the NMOS transistor 27 is connected to the output terminal OP20.

The differential amplifier 20 configured as described above non-inversely amplifies a pair of signals input to the input terminal IP20 and the input terminal IN20, and then outputs the result from the output terminal OP20 and the output terminal ON20.

Going back to FIG. 6, in the present embodiment, due to the SAW filter 2, the phase shift circuit 10, and the differential amplifier 20, a pair of signals propagate on the signal path from the first output port OP1 and the second output port OP2 to the first input port IP1 and the second input port IP2 of the SAW filter 2 to form a positive-feedback closed loop, and the pair of signals turn to an oscillation signal. Therefore, the SAW filter 2, the phase shift circuit 10, and the differential amplifier 20 constitute an oscillation circuit 100. It should be noted that the oscillation circuit 100 can have a configuration obtained by arbitrarily eliminating or modifying some of these constituents, or adding other constituents.

Figure 8:
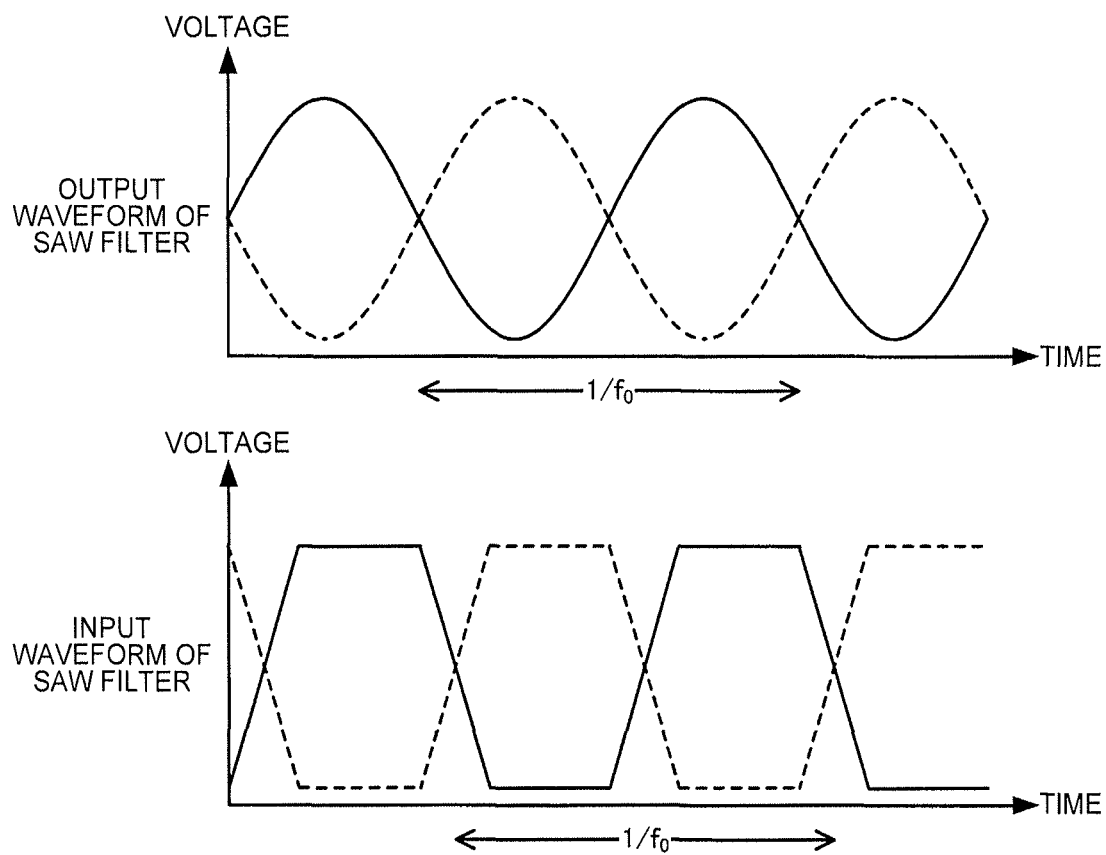
FIG. 8 is a diagram showing an example of input and output waveforms of the SAW filter.

In the upper part of FIG. 8, the waveform of the signal (frequency $f_0$) output from the first output port OP1 of the SAW filter 2 is indicated by the solid line, and the waveform of the signal (frequency $f_0$) output from the second output port OP2 of the SAW filter 2 is indicated by the dotted line. Further, in the lower part of FIG. 8, the waveform of the signal (frequency $f_0$) input to the first input port IP1 of the SAW filter 2 is indicated by the solid line, and the waveform of the signal (frequency $f_0$) input to the second input port IP2 of the SAW filter 2 is indicated by the dotted line.

As shown in FIG. 8, the signal (the solid line) propagating from the first output port OP1 to the first input port IP1 of the SAW filter 2 and the signal (the dotted line) propagating from the second output port OP2 to the second input port IP2 of the SAW filter 2 are reversed in phase from each other. Here, "reversed in phase from each other" is a concept including not only the case in which the phase difference is accurately 180°, but also the case in which, for example, the phase difference is different from 180° as much as the difference in the characteristics between the elements provided to the differential amplifier 20 caused by a difference in length, resistance, and capacitance between the interconnection of the feedback path from the first output port OP1 to the first input port IP1 of the SAW filter 2 and the interconnection of the feedback path from the second output port OP2 to the second input port IP2 of the SAW filter 2, and the production error.

As described above, the oscillation circuit 100 of the present embodiment amplifies the differential signals (the pair of signals reversed in phase from each other) output from the first output port OP1 and the second output port OP2 of the SAW filter 2 with the differential amplifier 20, feeds the result back to the first input port IP1 and the second input port IP2 of the SAW filter 2 to thereby constitute the closed-loop feedback paths, and thus oscillates. Specifically, the oscillation circuit 100 acts in a differential manner, and oscillates with the frequency $f_0$ corresponding to the electrode finger pitch $d_1$ of the first IDT 201 and the second IDT 202.

Further, the power supply noise superimposed on the differential signals, which propagate on the feedback paths from the first output port OP1 and the second output port OP2 to the first input port IP1 and the second input port IP2 of the SAW filter 2, via the power supply line is a common-mode noise, and is therefore significantly reduced by the differential amplifier 20. Therefore, according to the oscillation circuit 100, it is possible to reduce the deterioration of the oscillation signal due to the influence of the power supply noise to thereby improve the frequency accuracy and the S/N ratio of the oscillation signal.

Further, the oscillation circuit 100 according to the present embodiment is capable of changing the frequency $f_0$ of the oscillation signal with a variation corresponding to the inductance of the coil 11 and the inductance of coil 12 within the passband of the SAW filter 2 by varying the capacitance value of the variable-capacitance element 13 of the phase shift circuit 10. The higher the inductance of the coil 11 and the inductance of the coil 12 are, the larger the variation of the frequency $f_0$ is.

Further, in the oscillation circuit 100 according to the present embodiment, currents having phases reversed from each other flow respectively through the coil 11 and the coil 12. Therefore, since the magnetic field generated by the coil 11 and the magnetic field generated by the coil 12 have directions opposite to each other to weaken each other, the deterioration of the oscillation signal due to the influence of the magnetic fields can be reduced.

Further, in contrast to the fact that an SAW resonator is steep in frequency characteristic with respect to the reactance, the SAW filter 2 is linear (gentle) in frequency characteristic with respect to the reactance. Therefore, the oscillation circuit 100 according to the present embodiment has an advantage that the control of the variation of the frequency $f_0$ is easy compared to the oscillation circuit using the SAW resonator.

Going back to FIG. 6, in the oscillation module 1, the capacitor 32, the capacitor 34, the differential amplifier 40, the capacitor 52, the capacitor 54, the multiplier circuit 60, the high-pass filter 70, and the output circuit 80 are disposed in the posterior stage of the oscillation circuit 100.

One end of the capacitor 32 is connected to the non-inverted output terminal (the output terminal OP20 in FIG. 7) of the differential amplifier 20, and the other end of the capacitor 32 is connected to the non-inverting input terminal of the differential amplifier 40. Further, one end of the capacitor 34 is connected to the inverted output terminal (the output terminal ON20 in FIG. 7) of the differential amplifier 20, and the other end of the capacitor 34 is connected to the inverting input terminal of the differential amplifier 40. The capacitor 32 and the capacitor 34 function as DC cutting capacitors to remove DC components of the respective signals output from the non-inverted output terminal (the output terminal OP20 in FIG. 7) and the inverted output terminal (the output terminal ON20 in FIG. 7) of the differential amplifier 20.

The differential amplifier 40 is disposed on the signal path from the oscillation circuit 100 to the multiplier circuit 60. The differential amplifier 40 outputs the differential signals, which are obtained by amplifying the differential signals input to the non-inverting input terminal and the inverting input terminal, from a non-inverted output terminal and an inverted output terminal.

Figure 9:
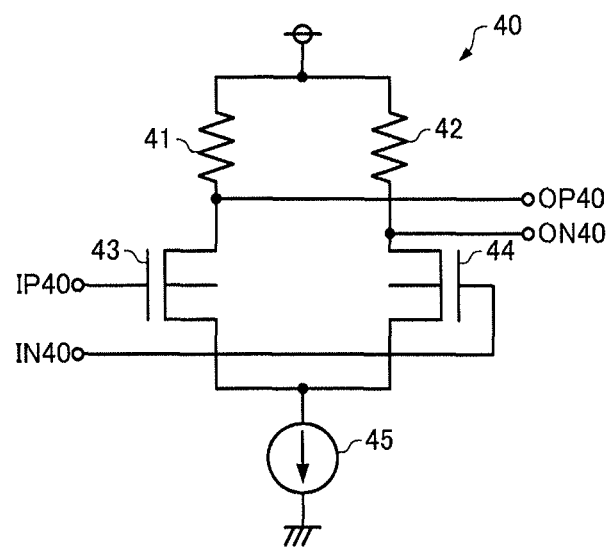
FIG. 9 is a diagram showing an example of a circuit configuration of a differential amplifier.

FIG. 9 is a diagram showing an example of a circuit configuration of the differential amplifier. In the example shown in FIG. 9, the differential amplifier 40 is configured including a resistor 41, a resistor 42, an NMOS transistor 43, an NMOS transistor 44, and a constant current source 45. In FIG. 9, for example, an input terminal IP40 is a non-inverting input terminal, and an input terminal IN40 is an inverting input terminal. Further, an output terminal OP40 is a non-inverted output terminal, and an output terminal ON40 is an inverted output terminal.

In the NMOS transistor 43, the gate terminal is connected to the input terminal IP40, the source terminal is connected to one end of the constant current source 45, and the drain terminal is connected to the power supply terminal T7 (see FIG. 6) via the resistor 41.

In the NMOS transistor 44, the gate terminal is connected to the input terminal IN40, the source terminal is connected to the one end of the constant current source 45, and the drain terminal is connected to the power supply terminal T7 (see FIG. 6) via the resistor 42.

The other end of the constant current source 45 is connected to the ground terminal T8 (see FIG. 6).

Further, the drain terminal of the NMOS transistor 43 is connected to the output terminal OP40, and the drain terminal of the NMOS transistor 44 is connected to the output terminal ON40.

The differential amplifier 40 configured as described above non-inversely amplifies differential signals input to the input terminal IP40 and the input terminal IN40, and then outputs the differential signals thus amplified from the output terminal OP40 and the output terminal ON40.

Going back to FIG. 6, one end of the capacitor 52 is connected to the non-inverted output terminal (the output terminal OP40 in FIG. 9) of the differential amplifier 40, and the other end of the capacitor 52 is connected to the non-inverting input terminal of the multiplier circuit 60. Further, one end of the capacitor 54 is connected to the inverted output terminal (the output terminal ON40 in FIG. 9) of the differential amplifier 40, and the other end of the capacitor 54 is connected to the inverting input terminal of the multiplier circuit 60. The capacitor 52 and the capacitor 54 function as DC cutting capacitors to remove DC components of the respective signals output from the non-inverted output terminal (the output terminal OP40 in FIG. 9) and the inverted output terminal (the output terminal ON40 in FIG. 9) of the differential amplifier 40.

The multiplier circuit 60 operates in a differential manner, and outputs the differential signals, which are obtained by multiplying the frequency $f_0$ of the differential signals input to the non-inverting input terminal and the inverting input terminal, from a non-inverted output terminal and an inverted output terminal.

Figure 10:
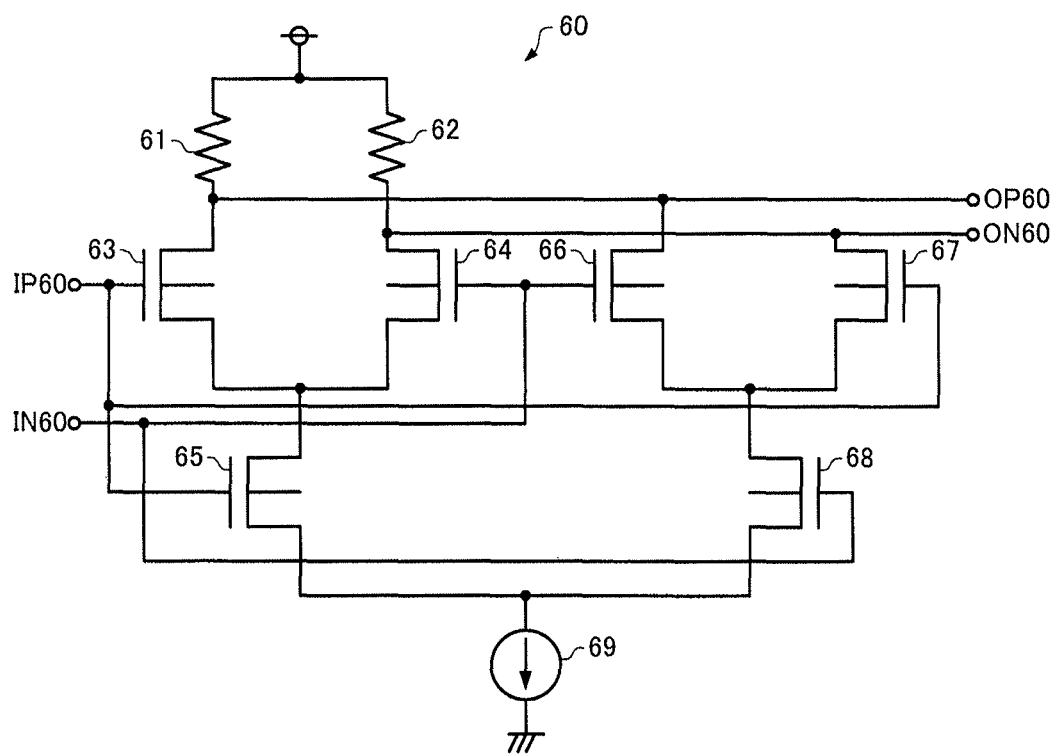
FIG. 10 is a diagram showing an example of a circuit configuration of a multiplier circuit.

FIG. 10 is a diagram showing an example of a circuit configuration of the multiplier circuit. In the example shown in FIG. 10, the multiplier circuit 60 is configured including a resistor 61, a resistor 62, an NMOS transistor 63, an NMOS transistor 64, an NMOS transistor 65, an NMOS transistor 66, an NMOS transistor 67, and NMOS transistor 68, and a constant current source 69. In FIG. 10, for example, an input terminal IP60 is a non-inverting input terminal, and an input terminal IN60 is an inverting input terminal. Further, an output terminal OP60 is a non-inverted output terminal, and an output terminal ON60 is an inverted output terminal.

In the NMOS transistor 63, the gate terminal is connected to the input terminal IP60, the source terminal is connected to the drain terminal of the NMOS transistor 65, and the drain terminal is connected to the power supply terminal T7 (see FIG. 6) via the resistor 61.

In the NMOS transistor 64, the gate terminal is connected to the input terminal IN60, the source terminal is connected to the drain terminal of the NMOS transistor 65, and the drain terminal is connected to the power supply terminal T7 (see FIG. 6) via the resistor 62.

In the NMOS transistor 65, the gate terminal is connected to the input terminal IP60, the source terminal is connected to one end of the constant current source 69, and the drain terminal is connected to the source terminal of the NMOS transistor 63 and the source terminal of the NMOS transistor 64.

In the NMOS transistor 66, the gate terminal is connected to the input terminal IN60, the source terminal is connected to the drain terminal of the NMOS transistor 68, and the drain terminal is connected to the power supply terminal T7 (see FIG. 6) via the resistor 61.

In the NMOS transistor 67, the gate terminal is connected to the input terminal IP60, the source terminal is connected to the drain terminal of the NMOS transistor 68, and the drain terminal is connected to the power supply terminal T7 (see FIG. 6) via the resistor 62.

In the NMOS transistor 68, the gate terminal is connected to the input terminal IN60, the source terminal is connected to the one end of the constant current source 69, and the drain terminal is connected to the source terminal of the NMOS transistor 66 and the source terminal of the NMOS transistor 67.

The other end of the constant current source 69 is connected to the ground terminal T8 (see FIG. 6).

Further, the drain terminal of the NMOS transistor 63 and the drain terminal of the NMOS transistor 66 are connected to the output terminal OP60, and the drain terminal of the NMOS transistor 64 and the drain terminal of the NMOS transistor 67 are connected to the output terminal ON60.

The multiplier circuit 60 configured as described above generates differential signals with the frequency $2f_0$ twice as high as the frequency $f_0$ of the differential signals input to the input terminal IP60 and the input terminal IN60, and then outputs the result from the output terminal OP60 and the output terminal ON60. In particular, the multiplier circuit 60 is a balanced modulation circuit, and in principle, has a configuration in which the differential signals (the signals with the frequency $f_0$) input to the input terminal IP60 and the input terminal IN60 are not output from the output terminal OP60 and the output terminal ON60. According to this multiplier circuit 60, it is possible to reduce the signal component with the frequency $f_0$ output from the output terminal OP60 and the output terminal ON60 even taking the production tolerance of the NMOS transistors and the resistors into consideration, and the differential signals with the frequency $2f_0$ high in purity (high in frequency accuracy) can be obtained, and at the same time, the circuit area is also relatively small.

Going back to FIG. 6, the non-inverted output terminal (the output terminal OP60 in FIG. 10) of the multiplier circuit 60 is connected to a non-inverting input terminal of the high-pass filter 70. Further, the inverted output terminal (the output terminal ON60 in FIG. 10) of the multiplier circuit 60 is connected to an inverting input terminal of the high-pass filter 70.

The high-pass filter 70 is disposed on the signal path from the multiplier circuit 60 to the output circuit 80. The high-pass filter 70 operates in a differential manner, and outputs the differential signals, which are obtained by attenuating the low-frequency component of the differential signals input to the non-inverting input terminal and the inverting input terminal, from a non-inverted output terminal and an inverted output terminal.

Figure 11:
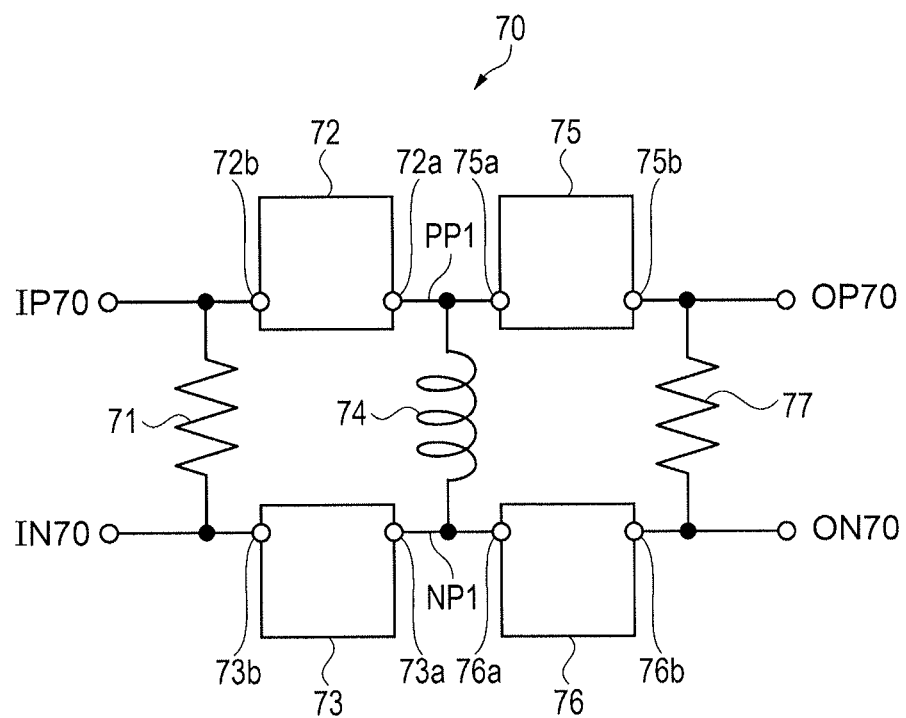
FIG. 11 is a schematic diagram showing an example of a circuit configuration of a high-pass filter.

FIG. 11 is a schematic diagram showing an example of a circuit configuration of the high-pass filter. In the example shown in FIG. 11, the high-pass filter 70 is configured including a resistor 71, a capacitance part 72, a capacitance part 73, a coil 74 as a coil part, a capacitance part 75, a capacitance part 76, a resistor 77, and first interconnections PP1, NP1 for connecting the coil 74 to the capacitance parts.

In FIG. 11, for example, an input terminal IP70 is a non-inverting input terminal, and an input terminal IN70 is an inverting input terminal. Further, an output terminal OP70 is a non-inverted output terminal, and an output terminal ON70 is an inverted output terminal.

One end of the resistor 71 is connected to the input terminal IP70 and a second terminal 72b of the capacitance part 72, and the other end of the resistor 71 is connected to the input terminal IN70 and a second terminal 73b of the capacitance part 73.

A first terminal 72a of the capacitance part 72 is connected to one end of the coil 74 and a first terminal 75a of the capacitance part 75 with the first interconnection PP1, and the second terminal 72b of the capacitance part 72 is connected to the input terminal IP70 and one end of the resistor 71.

A first terminal 73a of the capacitance part 73 is connected to the other end of the coil 74 and a first terminal 76a of the capacitance part 76 with the first interconnection NP1, and the second terminal 73b of the capacitance part 73 is connected to the input terminal IN70 and the other end of the resistor 71.

The one end of the coil 74 is connected to the first terminal 72a of the capacitance part 72 and the first terminal 75a of the capacitance part 75 with the first interconnection PP1, the other end of the coil 74 is connected to the first terminal 73a of the capacitance part 73 and the first terminal 76a of the capacitance part 76 with the first interconnection NP1.

The first terminal 75a of the capacitance part 75 is connected to the first terminal 72a of the capacitance part 72 and the one end of the coil 74 with the first interconnection PP1, and the second terminal 75b of the capacitance part 75 is connected to one end of the resistor 77.

The first terminal 76a of the capacitance part 76 is connected to the first terminal 73a of the capacitance part 73 and the other end of the coil 74 with the first interconnection NP1, and the second terminal 76b of the capacitance part 76 is connected to the other end of the resistor 77.

The one end of the resistor 77 is connected to the second terminal 75b of the capacitance part 75, and the other end of the resistor 77 is connected to the second terminal 76b of the capacitance part 76.

Further, the second terminal 75b of the capacitance part 75 and the one end of the resistor 77 are connected to the output terminal OP70, and the second terminal 76b of the capacitance part 76 and the other end of the resistor 77 are connected to the output terminal ON70.

It results that the first terminals of the capacitance parts are connected to the coil 74, and the second terminals of the capacitance parts are connected to the outside of the high-pass filter 70 via the respective input/output terminals as described above.

The high-pass filter 70 configured as described above generates the differential signals, which are obtained by attenuating the low-frequency component of the differential signals input to the input terminal IP70 and the input terminal IN70, and then outputs the result from the output terminal OP70 and the output terminal ON70.

Each of the capacitance parts of the high-pass filter 70 includes a capacitance array (an aggregate of capacitances (e.g., capacitors) arranged; a capacitance group).

Here, the capacitance part 72 is cited as an example, and the configuration of the capacitance part 72 will specifically be explained. The other capacitance parts 73, 75, and 76 are substantially the same in basic configuration as the capacitance part 72.

Figure 12:
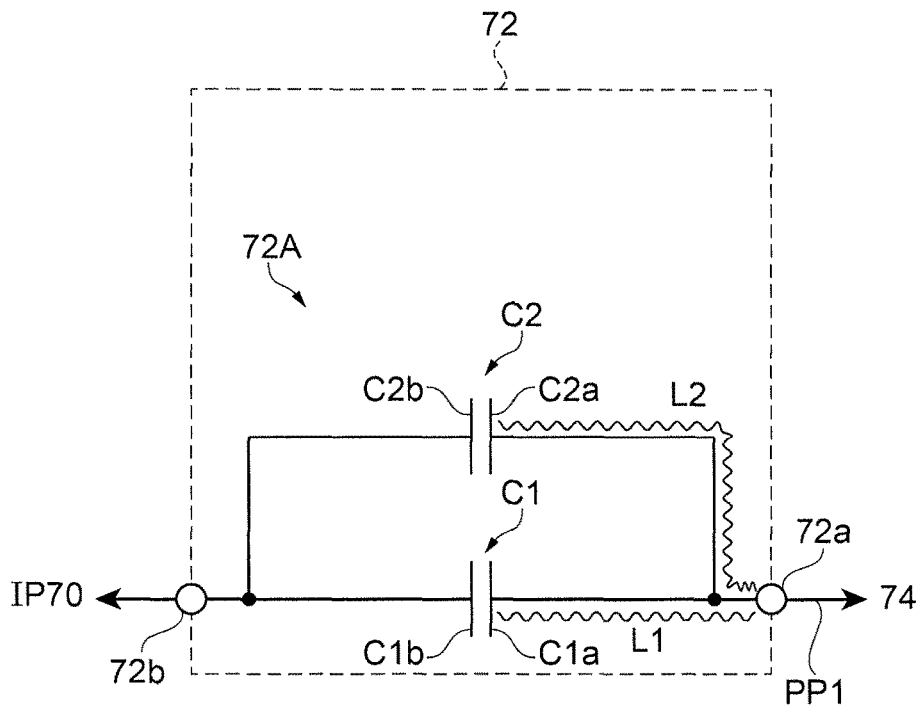
FIG. 12 is a schematic diagram showing an example of a configuration of a capacitance part.

FIG. 12 is a schematic diagram showing an example of the configuration of the capacitance part.

As shown in FIG. 12, the capacitance part 72 includes a capacitance array 72A. The capacitance array 72A includes a first capacitance C1 and a second capacitance C2.

Figure 13:
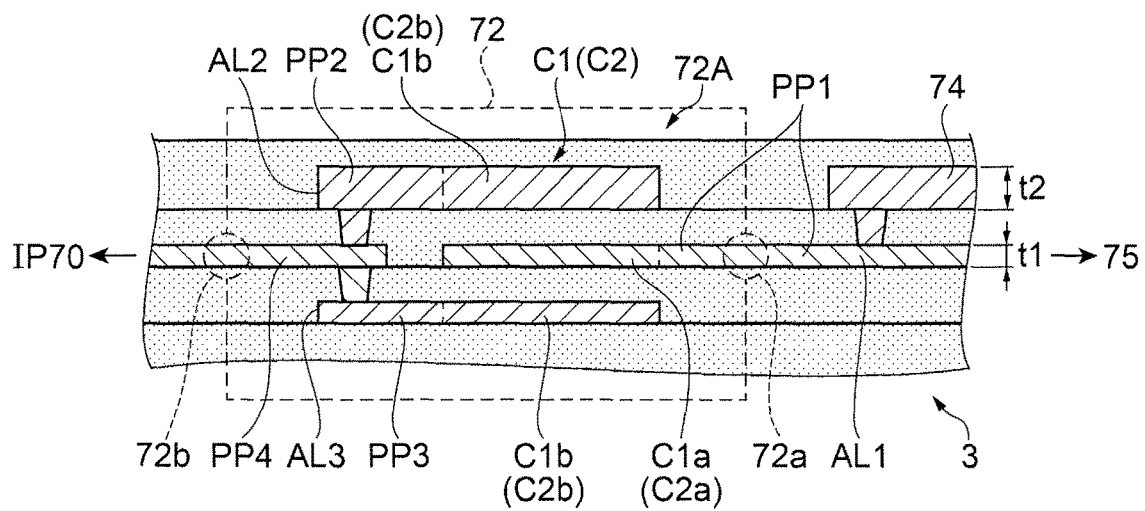
FIG. 13 is a schematic cross-sectional view showing a configuration of a first capacitance.

FIG. 13 is a schematic cross-sectional view showing a configuration of the first capacitance. It should be noted that the second capacitance C2 also has substantially the same configuration.

As shown in FIG. 13, one electrode C1a of the first capacitance C1 is disposed in a first wiring layer AL1.

The other electrode C1b of the first capacitance C1 is disposed so as to straddle a second wiring layer AL2 and a third wiring layer AL3, and is configured so that the first wiring layer AL1 in which the one electrode C1a is disposed is sandwiched by the second wiring layer AL2 and the third wiring layer AL3.

The second wiring layer AL2 is stacked above the first wiring layer AL1, and is formed to be thicker than the first wiring layer AL1 (t1<t2). It should be noted that the coil 74 is disposed in the second wiring layer AL2. The third wiring layer AL3 is stacked below the first wiring layer AL1.

In the first wiring layer AL1, there is disposed the first interconnection PP1. The first interconnection PP1 electrically connects the one electrode C1a of the first capacitance C1 and the first terminal 72a to each other. The first interconnection PP1 further connects electrically the first terminal 72a and the one end of the coil 74 to each other.

In the second wiring layer AL2, there is disposed a second interconnection PP2, and in the third wiring layer AL3, there is disposed a third interconnection PP3.

The second interconnection PP2 and the third interconnection PP3 are connected to a fourth interconnection PP4 disposed in the first wiring layer AL1, and electrically connect the other electrode C1b of the first capacitance C1 and the second terminal 72b to each other via the fourth interconnection PP4. It should be noted that the fourth interconnection PP4 further connects electrically the second terminal 72b and the input terminal IP70 to each other.

One electrode C2a of the second capacitance C2 is electrically connected to the one electrode C1a of the first capacitance C1 with the first interconnection PP1.

Further, the other electrode C2b of the second capacitance C2 is electrically connected to the other electrode C1b of the first capacitance C1 with the second interconnection PP2, the third interconnection PP3, and the fourth interconnection PP4.

It should be noted that in the oscillation module 1, the capacitance value of the first capacitance C1 and the capacitance value of the second capacitance C2 can roughly be equal to each other, or the capacitance value of the second capacitance C2 can be higher than the capacitance value of the first capacitance C1.

Here, it is assumed that, for example, the capacitance value of the second capacitance C2 is higher than the capacitance value of the first capacitance C1 (C1<C2).

Here, the wiring length L1 (the path with the wavy line connecting the first terminal 72a and the one electrode C1a to each other) of the first interconnection PP1 from the first terminal 72a to the first capacitance C1 (the one electrode C1a) is arranged to be shorter than the wiring length L2 (the path with the wavy line connecting the first terminal 72a and the one electrode C2a to each other) of the first interconnection PP1 from the first terminal 72a to the second capacitance C2 (the one electrode C2a) (L1<L2).

To wrap up the configuration described above, the oscillation module 1 is provided with the SAW filter 2 and the high-pass filter 70 formed in the integrated circuit 3. Further, the high-pass filter 70 has the coil 74 and the capacitance part (e.g., the capacitance part 72) including the capacitance array 72A.

Further, the capacitance array 72A includes the first terminal 72a connected to the coil 74, the first capacitance C1, and the second capacitance C2, and the capacitance value of the first capacitance C1 is arranged to be lower than the capacitance value of the second capacitance C2 (C1<C2).

At the same time, the wiring length L1 in the case in which the first capacitance C1 and the first terminal 72a are connected to each other is arranged to be shorter than the wiring length L2 in the case in which the second capacitance C2 and the first terminal 72a are connected to each other (L1<L2).

It should be noted that it is possible to dispose the first terminal 72a at an arbitrary position between the connection part with the coil 74 and the connection part with the one electrode C1a of the first capacitance C1 in the first interconnection PP1. Further, it is possible to dispose the second terminal 72b at an arbitrary position between the connection part with the input terminal IP70 and the connection part with the other electrode C1b of the first capacitance C1 in the fourth interconnection PP4. This also applies similarly to the following configuration examples.

It should be noted that each of the capacitances becomes in an unconnected state with respect to the coil 74 in some cases depending on the frequency band of the low frequency component to be attenuated by the high-pass filter 70, and in such a case, it is preferable for both of the one electrode and the other electrode to be connected to a predetermined fixed potential.

Then, another configuration example of the capacitance part 72 will be described.

Figure 14:
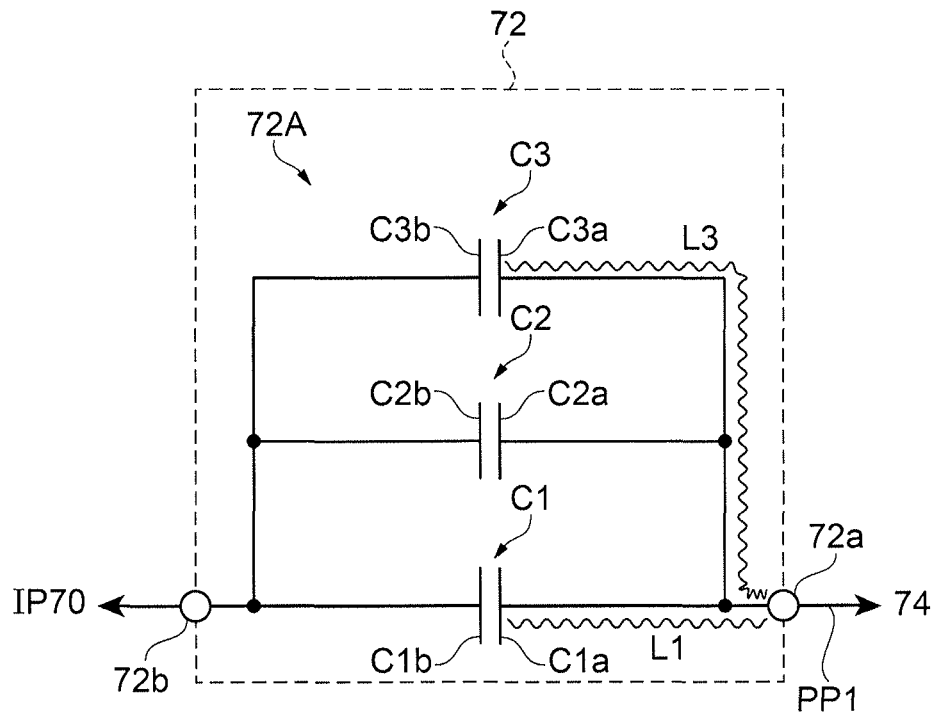
FIG. 14 is a schematic diagram showing another configuration example of the capacitance part.

FIG. 14 is a schematic diagram showing another configuration example of the capacitance part. It should be noted that the common parts to the configuration described above are denoted by the same reference numerals, the explanation thereof will be omitted, and different parts from the configuration described above will mainly be described.

As shown in FIG. 14, the capacitance part 72 includes the capacitance array 72A. The capacitance array 72A includes the first capacitance C1, the second capacitance C2, and a third capacitance C3. It should be noted that the basic configuration of the third capacitance C3 is substantially the same as those of the first capacitance C1 and the second capacitance C2.

One electrode C3a of the third capacitance C3 is electrically connected to the one electrode C1a of the first capacitance C1 and the one electrode C2a of the second capacitance C2 with the first interconnection PP1.

Further, the other electrode C3b of the third capacitance C3 is electrically connected to the other electrodes C1b, C2b of the first capacitance C1 and the second capacitance C2 with the second interconnection PP2, the third interconnection PP3, and the fourth interconnection PP4 (see FIG. 13).

Here, the sum of the capacitance value of the first capacitance C1 and the capacitance value of the second capacitance C2 is arranged to be lower than the capacitance value of the third capacitance C3 ((C1+C2)<C3). Further, the wiring length L1 in the case in which the first capacitance C1 (the one electrode C1a) is electrically connected to the first terminal 72a with the first interconnection PP1 is arranged to be shorter than the wiring length L3 (the path with the wavy line connecting the first terminal 72a and the one electrode C3a to each other) in the case in which the third capacitance C3 (the one electrode C3a) is electrically connected to the first terminal 72a with the first interconnection PP1 (L1<L3).

To wrap up the configuration described above, the oscillation module 1 is provided with the SAW filter 2 and the high-pass filter 70 formed in the integrated circuit 3. Further, the high-pass filter 70 has the coil 74 and the capacitance part (e.g., the capacitance part 72) including the capacitance array 72A.

Further, the capacitance array 72A includes the first terminal 72a connected to the coil 74, the first capacitance C1, the second capacitance C2, and the third capacitance C3, and sum of the capacitance value of the first capacitance C1 and the capacitance value of the second capacitance C2 is arranged to be lower than the capacitance value of the third capacitance C3 ((C1+C2)<C3).

At the same time, the wiring length L1 in the case in which the first capacitance C1 is connected to the first terminal 72a is arranged to be shorter than the wiring length L3 in the case in which the third capacitance C3 is connected to the first terminal 72a (L1<L3).

It should be noted that each of the capacitances becomes in an unconnected state with respect to the coil 74 in some cases depending on the frequency band of the low frequency component to be attenuated by the high-pass filter 70, and in such a case, it is preferable for both of the one electrode and the other electrode to be connected to a predetermined fixed potential.

It should be noted that the capacitance value of the third capacitance C3 can also be roughly the same as the capacitance value of the first capacitance C1 or the capacitance value of the second capacitance C2.

Then, another configuration example of the capacitance part 72 will be described.

Figure 15:
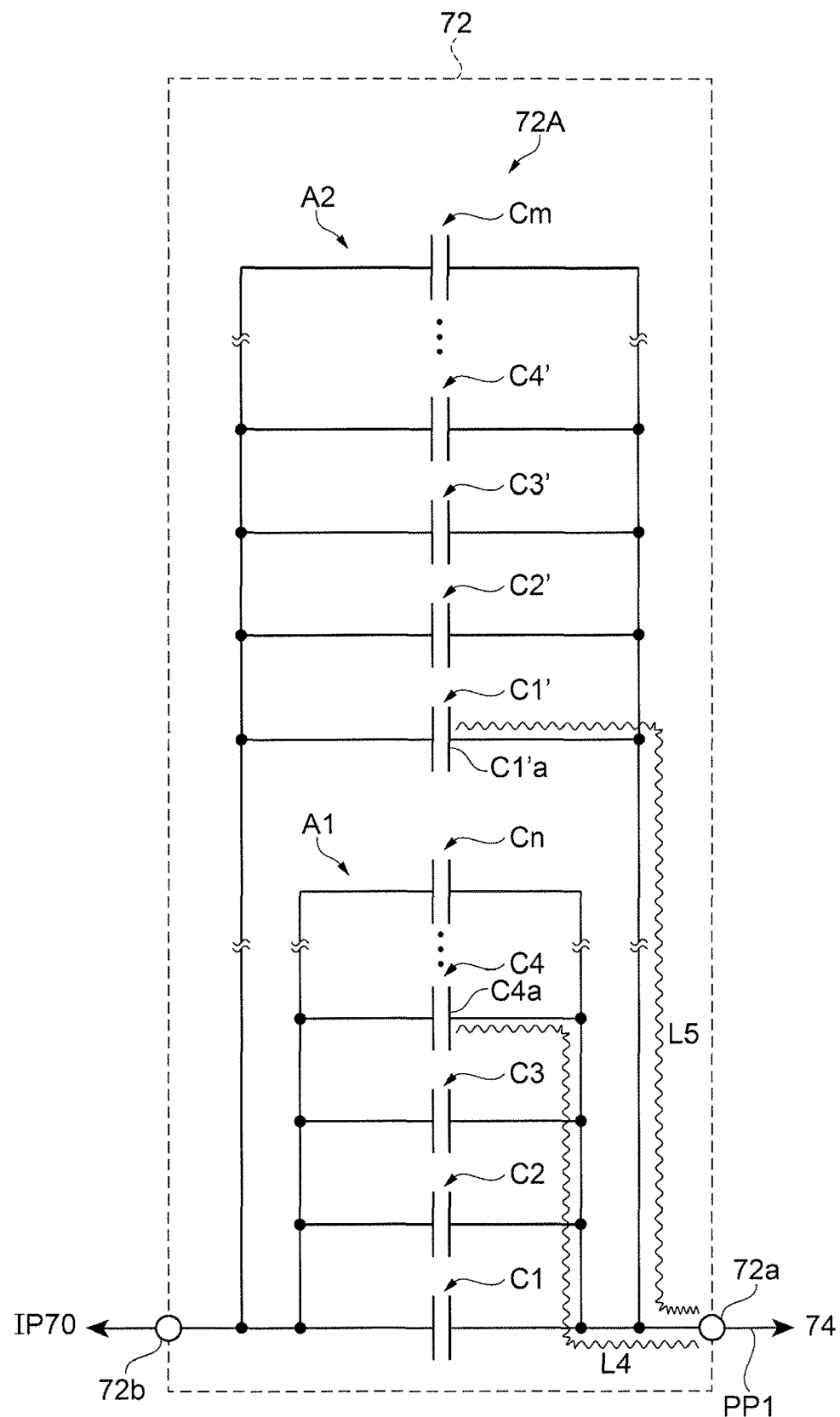
FIG. 15 is a schematic diagram showing another configuration example of the capacitance part.

FIG. 15 is a schematic diagram showing another configuration example of the capacitance part.

As shown in FIG. 15, the capacitance part 72 includes the capacitance array 72A.

The capacitance array 72A includes the first terminal 72a connected to the coil 74, a first array A1 formed of n (n is an integer) capacitances (the first capacitance C1 through an $n^{th}$ capacitance Cn) connected to each other, and a second array A2 formed of m (m is an integer) capacitances (the first capacitance C1' through an m-th capacitance Cm) connected to each other.

Here, the total capacitance value (the sum of the capacitance values of the first capacitance C1 through the $n^{th}$ capacitance Cn) of the first array A1 is arranged to be lower than the total capacitance value (the sum of the capacitance values of the first capacitance C1' through the m-th capacitance Cm) of the second array A2.

Further, the wiring length in the case in which one of the capacitances belonging to the first array A1 and the first terminal 72a are electrically connected to each other is arranged to be shorter than the wiring length in the case in which one of the capacitances belonging to the second array A2 and the first terminal 72a are electrically connected to each other.

In one example, the wiring length L4 (the path with the wavy line connecting the one electrode C4a and the first terminal 72a to each other) in the case in which the fourth capacitance C4 (the one electrode C4a) belonging to the first array A1 and the first terminal 72a are electrically connected to each other with the first interconnection PP1 is arranged to be shorter than the wiring length L5 (the path with the wavy line connecting the one electrode C1'a and the first terminal 72a to each other) in the case in which the first capacitance C1' (the one electrode C1'a) belonging to the second array A2 and the first terminal 72a are electrically connected to each other with the first interconnection PP1.

To wrap up the configuration described above, the oscillation module 1 is provided with the SAW filter 2 and the high-pass filter 70 formed in the integrated circuit 3. Further, the high-pass filter 70 has the coil 74 and the capacitance part (e.g., the capacitance part 72) including the capacitance array 72A.

Further, the capacitance array 72A includes the first terminal 72a connected to the coil 74, the first array A1 of the n capacitances connected to each other, and the second array A2 of the m capacitances connected to each other, and the total capacitance value of the first array A1 is arranged to be lower than the total capacitance value of the second array A2.

Further, the wiring length (e.g., L4) in the case in which one (e.g., the fourth capacitance C4) of the capacitances belonging to the first array A1 and the first terminal 72a are connected to each other is arranged to be shorter than the wiring length (e.g., L5) in the case in which one (e.g., the first capacitance C1') of the capacitances belonging to the second array A2 and the first terminal 72a are connected to each other.

It should be noted that each of the capacitances in each of the arrays becomes in an unconnected state with respect to the coil 74 in some cases depending on the frequency band of the low frequency component to be attenuated by the high-pass filter 70, and in such a case, it is preferable for both of the one electrode and the other electrode to be connected to a predetermined fixed potential.

Figure 16:
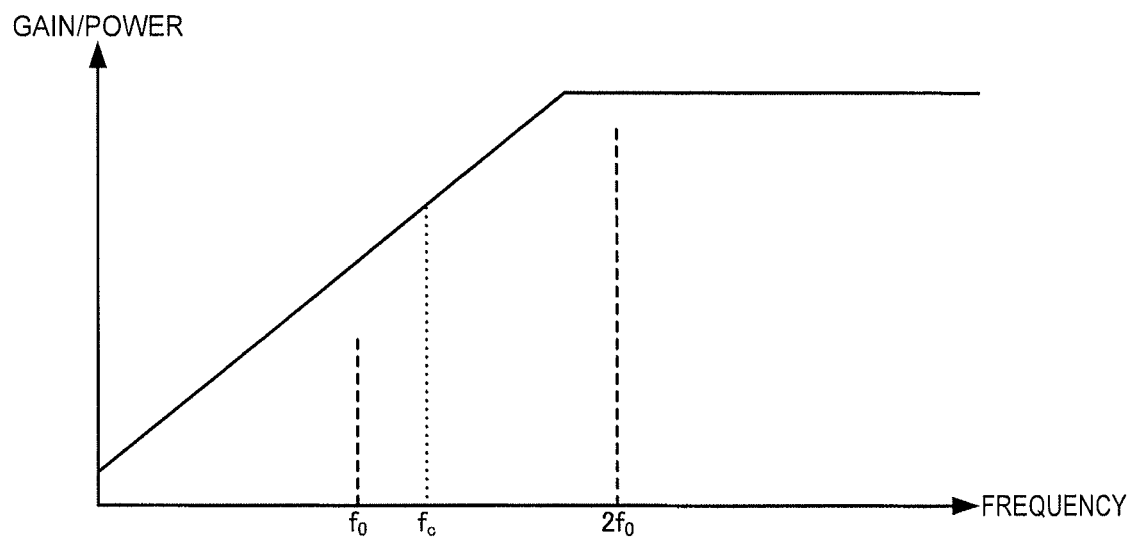
FIG. 16 is a diagram showing an example of the frequency characteristic of the high-pass filter.

FIG. 16 is a diagram showing an example of the frequency characteristic of the high-pass filter. In FIG. 16, the frequency spectrum of the output signal of the multiplier circuit 60, which is the input signal of the high-pass filter 70, is also illustrated with the dotted lines. In FIG. 16, the horizontal axis represents the frequency, and the vertical axis represents the gain (in the case of the frequency characteristic of the high-pass filter 70) or the power (in the case of the frequency spectrum of the output signal of the multiplier circuit 60). As shown in FIG. 16, the resistance values of the respective resistors, the capacitance values of the respective capacitance parts, and the inductance value of the coil 74 are set so that the cutoff frequency $f_c$ of the high-pass filter 70 takes a value between $f_0$ and $2f_0$. As described above, although the multiplier circuit 60 outputs the differential signals with the frequency $2f_0$ high in purity (high in frequency accuracy) and small in signal component of $f_0$, since the signal component of $f_0$ lower than the cutoff frequency $f_c$ is attenuated by the high-pass filter as shown in FIG. 16, the differential signals with the frequency $2f_0$ higher in purity (higher in frequency accuracy) can be obtained.

Going back to FIG. 6, the non-inverted output terminal (the output terminal OP70 in FIG. 11) of the high-pass filter 70 is connected to a non-inverting input terminal of the output circuit 80. Further, the inverted output terminal (the output terminal ON70 in FIG. 11) of the high-pass filter 70 is connected to an inverting input terminal of the output circuit 80.

The output circuit 80 is disposed in the posterior stage of the multiplier circuit 60 and the high-pass filter 70. The output circuit 80 operates in a differential manner, generates the differential signals, which are obtained by converting the differential signals input to the non-inverting input terminal and the inverting input terminal into signals having desired voltage levels (or current levels), and outputs the result from a non-inverted output terminal and an inverted output terminal. The non-inverted output terminal of the output circuit 80 is connected to an output terminal T5 of the integrated circuit 3, and the inverted output terminal of the output circuit 80 is connected to an output terminal T6 of the integrated circuit 3. The output terminal T5 of the integrated circuit 3 is connected to a CP terminal as the external terminal of the oscillation module 1, and the output terminal T6 of the integrated circuit 3 is connected to a CN terminal as the external terminal of the oscillation module 1. Further, the differential signals (the oscillation signals) converted by the output circuit 80 are output to the outside from the CP terminal and the CN terminal of the oscillation module 1 via the output terminal T5 and the output terminal T6 of the integrated circuit 3.

Figure 17:
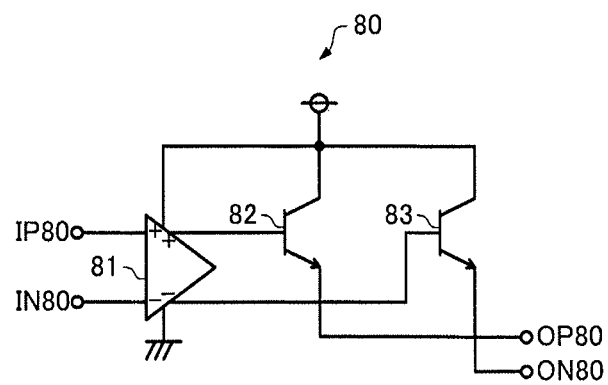
FIG. 17 is a diagram showing an example of a circuit configuration of an output circuit.

FIG. 17 is a diagram showing an example of a circuit configuration of the output circuit. In the example shown in FIG. 17, the output circuit 80 is configured including a differential amplifier 81, an NPN transistor 82, and an NPN transistor 83. In FIG. 17, for example, an input terminal IP80 is a non-inverting input terminal, and an input terminal IN80 is an inverting input terminal. Further, an output terminal OP80 is a non-inverted output terminal, and an output terminal ON80 is an inverted output terminal.

In the differential amplifier 81, the non-inverting input terminal is connected to the input terminal IP80, the inverting input terminal is connected to the input terminal IN80, the non-inverted output terminal is connected to the base terminal of the NPN transistor 82, the inverted output terminal is connected to the base terminal of the NPN transistor 83, and the differential amplifier 81 operates with the power supply voltage VDD supplied from the power supply terminal T7 (see FIG. 6) and the ground terminal T8.

In the NPN transistor 82, the base terminal is connected to the non-inverted output terminal of the differential amplifier 81, the collector terminal is connected to the power supply terminal T7 (see FIG. 6), and the emitter terminal is connected to the output terminal OP80.

In the NPN transistor 83, the base terminal is connected to the inverted output terminal of the differential amplifier 81, the collector terminal is connected to the power supply terminal T7 (see FIG. 6), and the emitter terminal is connected to the output terminal ON80.

The output circuit 80 configured as described above is a PECL (positive emitter coupled logic) circuit or an LV-PECL (low-voltage positive emitter coupled logic) circuit, and by pulling down the output terminal OP80 and the output terminal ON80 to a predetermined potential V1, the output circuit 80 converts the differential signals input from the input terminal IP80 and the input terminal IN80 into differential signals, the high level of which is defined as VDD-$V_{CE}$, and the low level of which is defined as V1, and then outputs the result from the output terminal OP80 and the output terminal ON80. It should be noted that $V_{CE}$ denotes the voltage between the collector and the emitter of the NPN transistor 82 or the NPN transistor 83.

As described above, the oscillation module 1 according to the present embodiment is provided with the SAW filter 2, and the high-pass filter 70 formed in the integrated circuit 3, wherein the high-pass filter 70 has the coil 74, the capacitance parts (e.g., the capacitance part 72), and the first interconnection PP1 for connecting the coil 74 and the capacitance parts (e.g., the capacitance part 72) to each other, and the capacitance part 72 includes the capacitance array 72A.

According to this configuration, in the oscillation module 1, by selecting the capacitance (e.g., the first capacitance C1, the second capacitance C2) in the capacitance array 72A of the capacitance part 72, it is possible to set a desired frequency band to the passband of the high-pass filter 70.

Thus, even if the oscillation frequency changes due to the change of the SAW filter 2, the oscillation module 1 can deal with the change only by the adjustment (specifically, a change of the wiring pattern by a mask change of the first wiring layer AL1) of the capacitance array 72A of the high-pass filter 70.

As a result, it is possible for the oscillation module 1 to achieve shortening of turnaround time and reduction in cost with respect to the change (serialization of the oscillation frequency) in frequency band of the oscillation signal using the master slice.

Further, in the oscillation module 1, since the coil 74 is disposed in the second wiring layer AL2 thicker than the first wiring layer AL1 in which the first interconnection PP1 is disposed, a variation in inductance of the coil 74 can be suppressed.

Further, in the oscillation module 1, since the second wiring layer AL2 is stacked above the first wiring layer AL1, it is also possible to form the capacitance part 72 (the capacitance array 72A) using the second wiring layer AL2 and the first wiring layer AL1.

Further, in the oscillation module 1, since the capacitance array 72A includes the first capacitance C1, and at least one electrode C1a of the first capacitance C1 is disposed in the first wiring layer AL1, a part of the first interconnection PP1 can be used as the one electrode C1a of the first capacitance C1.

Further, in the oscillation module 1, since the other electrode C1b of the first capacitance C1 is disposed so as to straddle the second wiring layer AL2 and the third wiring layer AL3, and is configured so that the first wiring layer AL1 is sandwiched by the second wiring layer AL2 and the third wiring layer AL3, the desired capacitance value can be obtained with a smaller plane area compared to other configurations.

Further, the oscillation module 1 is provided with the first terminal 72a connected to the coil 74 and the second terminal 72b connected to the outside of the high-pass filter 70, wherein the first interconnection PP1 electrically connects the one electrode C1a of the first capacitance C1 and the first terminal 72a to each other, and the second interconnection PP2 and the third interconnection PP3 electrically connect the other electrode C1b of the first capacitance C1 and the second terminal 72b to each other.

According to this configuration, in the oscillation module 1, the frequency band corresponding to the first capacitance C1 can be set as the passband of the high-pass filter 70.

Thus, even if the oscillation frequency changes due to the change of the SAW filter 2, the oscillation module 1 can deal with the change only by the adjustment of the capacitance array 72A of the high-pass filter 70.

Further, in the oscillation module 1, since the capacitance array 72A includes the second capacitance C2, and the one electrode C2a of the second capacitance C2 is connected to the one electrode C1a of the first capacitance C1 with the first interconnection PP1, the frequency band corresponding to the sum of the capacitance value of the first capacitance C1 and the capacitance value of the second capacitance C2 can be set as the passband of the high-pass filter 70.

Thus, even if the oscillation frequency changes due to the change of the SAW filter 2, the oscillation module 1 can deal with the change only by the adjustment of the capacitance array 72A of the high-pass filter 70, and the range of the change which can be dealt with can be increased compared to the case only with the first capacitance C1.

Further, in the oscillation module 1, in the case in which the capacitance value of the first capacitance C1 and the capacitance value of the second capacitance C2 are roughly equal to each other, by copying and pasting the design data of the first capacitance C1, the layout design of the integrated circuit 3 becomes easy.

Further, in the oscillation module 1, in the case in which the capacitance value of the second capacitance C2 is higher than the capacitance value of the first capacitance C1, the range of the change which can be dealt with to the change in the oscillation frequency due to the change of the SAW filter 2 can be increased compared to the case in which the capacitance value of the first capacitance C1 and the capacitance value of the second capacitance C2 are roughly equal to each other.

Further, in the oscillation module 1, the wiring length L1 of the first interconnection PP1 from the first terminal 72a to the first capacitance C1 is shorter than the wiring length L2 of the first interconnection PP1 from the first terminal 72a to the second capacitance C2.

For this reason, in the oscillation module 1, it is possible to reduce the variation in impedance and the variation in parasitic capacitance due to the wiring length L1 of the first interconnection PP1, the influence of which becomes greater as the capacitance value of the first capacitance C1 decreases.

Thus, it is possible for the oscillation module 1 to output the oscillation signal high in frequency accuracy.

Further, in the oscillation module 1, as another configuration, the capacitance array 72A includes the third capacitance C3, the one electrode C3a of the third capacitance C3 is connected to the one electrode C1a of the first capacitance C1 and the one electrode C2a of the second capacitance C2 with the first interconnection PP1.

According to this configuration, in the oscillation module 1, the frequency band corresponding to the sum of the capacitance value of the first capacitance C1, the capacitance value of the second capacitance C2, and the capacitance value of the third capacitance C3 can be used as the pass-band of the high-pass filter 70.

Thus, even if the oscillation frequency changes due to the change of the SAW filter 2, the oscillation module 1 can deal with the change only by the adjustment of the capacitance array 72A of the high-pass filter 70, and the range of the change which can be dealt with can be increased compared to the case only with the first capacitance C1 and the second capacitance C2.

According to the first configuration (e.g., FIG. 12), the oscillation module 1 is provided with the SAW filter 2 and the high-pass filter 70 formed in the integrated circuit 3, the high-pass filter 70 has the coil 74, the capacitance part 72 including the capacitance array 72A, and the capacitance array 72A includes the first terminal 72a connected to the coil 74, the first capacitance C1 and the second capacitance C2.

Further, the capacitance value of the first capacitance C1 is lower than the capacitance value of the second capacitance C2, and the wiring length L1 in the case in which the first capacitance C1 and the first terminal 72a are connected to each other is arranged to be shorter than the wiring length L2 in the case in which the second capacitance C2 and the first terminal 72a are connected to each other.

For this reason, in the oscillation module 1, it is possible to reduce the variation in impedance and the variation in parasitic capacitance due to the wiring length L1, the influence of which becomes greater as the capacitance value of the first capacitance C1 decreases.

Thus, it is possible for the oscillation module 1 to output the oscillation signal high in frequency accuracy.

Further, according to another configuration (e.g., FIG. 14), the oscillation module 1 is provided with the SAW filter 2 and the high-pass filter 70 formed in the integrated circuit 3, the high-pass filter 70 has the coil 74, the capacitance part 72 including the capacitance array 72A, and the capacitance array 72A includes the first terminal 72a connected to the coil 74, the first capacitance C1, the second capacitance C2, and the third capacitance C3.

Further, the sum of the capacitance value of the first capacitance C1 and the capacitance value of the second capacitance C2 is lower than the capacitance value of the third capacitance C3, and the wiring length L1 in the case in which the first capacitance C1 is connected to the first terminal 72a is arranged to be shorter than the wiring length L3 in the case in which the third capacitance C3 is connected to the first terminal 72a.

For this reason, in the oscillation module 1, it is possible to reduce the variation in impedance and the variation in parasitic capacitance due to the wiring length L1, the influence of which becomes greater as the capacitance value of the first capacitance C1 decreases.

Thus, it is possible for the oscillation module 1 to output the oscillation signal high in frequency accuracy.

Further, according to another configuration (e.g., FIG. 15), the oscillation module 1 is provided with the SAW filter 2 and the high-pass filter 70 formed in the integrated circuit 3, the high-pass filter 70 has the coil 74, the capacitance part 72 including the capacitance array 72A, and the capacitance array 72A includes the first terminal 72a connected to the coil 74, the first array A1 of the n capacitances connected to each other, and the second array A2 of the m capacitances connected to each other.

Further, the total capacitance value of the first array A1 is lower than the total capacitance value of the second array A2, the wiring length (e.g., L4) in the case in which one (e.g., the fourth capacitance C4) of the capacitances belonging to the first array A1 and the first terminal 72a are connected to each other is arranged to be shorter than the wiring length (e.g., L5) in the case in which one (e.g., the first capacitance C1') of the capacitances belonging to the second array A2 and the first terminal 72a are connected to each other.

For this reason, in the oscillation module 1, it is possible to reduce the variation in impedance and the variation in parasitic capacitance due to the wiring length (e.g., L4), the influence of which becomes greater as the total capacitance value of the first array A1 decreases.

Thus, it is possible for the oscillation module 1 to output the oscillation signal high in frequency accuracy.

2. Electronic Apparatus

Figure 18:
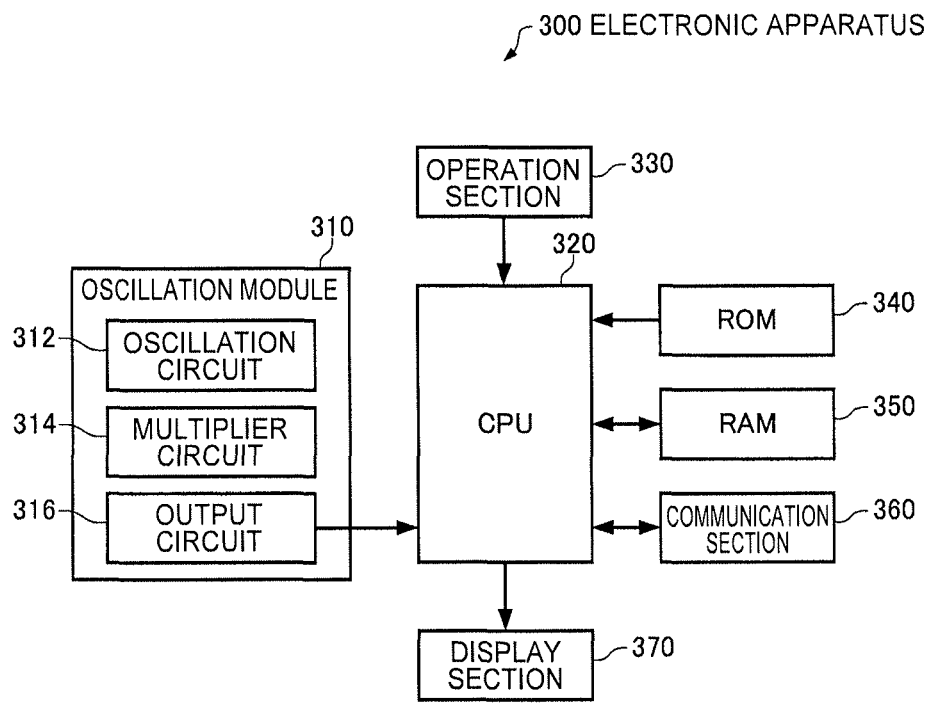
FIG. 18 is a functional block diagram showing an example of a configuration of an electronic apparatus according to an embodiment of the invention.

FIG. 18 is a functional block diagram showing an example of a configuration of an electronic apparatus according to the present embodiment. The electronic apparatus 300 according to the present embodiment is configured including an oscillation module 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 18, or adding other constituents thereto.

The oscillation module 310 is provided with an oscillation circuit 312. The oscillation circuit 312 is provided with an SAW filter not shown, and generates an oscillation signal with a frequency based on the resonance frequency of the SAW filter.

Further, the oscillation module 310 can also be provided with a multiplier circuit 314 and an output circuit 316 located in the posterior stage of the oscillation circuit 312. The multiplier circuit 314 generates an oscillation signal obtained by multiplying the frequency of the oscillation signal generated by the oscillation circuit 312. Further, the output circuit 316 outputs the oscillation signal generated by the multiplier circuit 314 or the oscillation signal generated by the oscillation circuit 312 to the CPU 320. The oscillation circuit 312, the multiplier circuit 314, and the output circuit 316 can operate in a differential manner.

The CPU 320 performs a variety of types of arithmetic processing and control processing using the oscillation signal input from the oscillation module 310 as a clock signal in accordance with the program stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on.

The operation section 330 is an input device constituted by operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the operation section 330, and the calculation result obtained by the CPU 320 performing operations in accordance with the variety of types of programs.

The communication section 360 performs a variety of types of control for achieving the data communication between the CPU 320 and the external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

By applying, for example, the oscillation circuit 100 according to the embodiment described above as the oscillation circuit 312, or by applying, for example, the oscillation module 1 according to the embodiment described above as the oscillation module 310, it is possible to realize the electronic apparatus high in reliability.

As such an electronic apparatus 300, a variety of electronic apparatuses can be adopted, and there can be cited, for example, a network apparatus such as an optical transmission device using an optical fiber or the like, a broadcast apparatus, a communication apparatus used in an artificial satellite or a base station, a GPS (global positioning system) module, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS (point of sale) terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 300 according to the present embodiment, there can be cited a transmission device using the oscillation module 310 described above as a reference signal source, and functioning as, for example, a terminal base station device for communicating with terminals wirelessly or with wire. By applying, for example, the oscillation module 1 according to the embodiment described above as the oscillation module 310, it is also possible to realize the electronic apparatus 300 which can be used for, for example, a communication base station, which is higher in frequency accuracy than ever before, and for which high performance and high reliability are required.

Further, as another example of the electronic apparatus 300 according to the present embodiment, it is possible to adopt a communication device in which the communication section 360 receives an external clock signal, and the CPU 320 (the processing section) includes a frequency control section for controlling the frequency of the oscillation module 310 based on the external clock signal and the output signal of the oscillation module 310.

3. Vehicle

Figure 19:
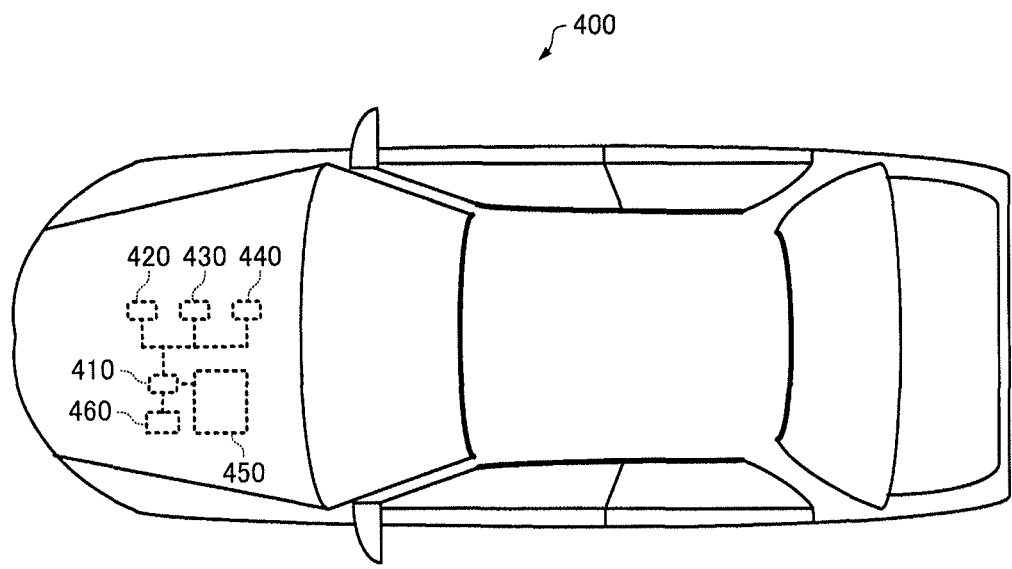
FIG. 19 is a diagram showing an example of a vehicle according to an embodiment of the invention.

FIG. 19 is a diagram (a top view) showing an example of a vehicle according to the present embodiment. The vehicle 400 shown in FIG. 19 is configured including an oscillation module 410, controllers 420, 430, and 440 for performing a variety of types of control such as an engine system, a brake system, or a keyless entry system, a battery 450, and a backup battery 460. It should be noted that the vehicle according to the present embodiment can have a configuration obtained by eliminating some of the constituents (sections) shown in FIG. 19, or adding other constituents thereto.

The oscillation module 410 is provided with an oscillation circuit (not shown) provided with an SAW filter not shown, and generates the oscillation signal with a frequency based on the resonance frequency of the SAW filter.

Further, the oscillation module 410 can also be provided with a multiplier circuit and an output circuit located in the posterior stage of the oscillation circuit. The multiplier circuit generates an oscillation signal obtained by multiplying the frequency of the oscillation signal generated by the oscillation circuit. Further, the output circuit outputs the oscillation signal generated by the multiplier circuit or the oscillation signal generated by the oscillation circuit. The oscillation circuit, the multiplier circuit, and the output circuit can operate in a differential manner.

The oscillation signal output by the oscillation module 410 is supplied to the controllers 420, 430, and 440, and is used as, for example, a clock signal.

The battery 450 supplies the oscillation module 410 and the controllers 420, 430, and 440 with electrical power. The backup battery 460 supplies the oscillation module 410 and the controllers 420, 430, and 440 with the electrical power when the output voltage of the battery 450 drops to a level lower than a threshold value.

By applying, for example, the oscillation circuit 100 according to the embodiment described above as the oscillation circuit provided to the oscillation module 410, or by applying, for example, the oscillation module 1 according to the embodiment described above as the oscillation module 410, it is possible to realize the vehicle high in reliability.

As such a vehicle 400, there can be adopted a variety of types of vehicles, and there can be cited a car (including an electric car), an aircraft such as a jet plane or a helicopter, a ship, a boat, a rocket, an artificial satellite, and so on.

The embodiments described above are illustrative only, and the invention is not limited to the present embodiment, but can be put into practice with various modification within the scope or the spirit of the invention.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations exerting the same functional effects and configurations capable of achieving the same object as the configuration described as one of the embodiments of the invention. Further, the invention includes configurations obtained by adding known technologies to the configuration described as one of the embodiments of the invention.

The entire disclosure of Japanese Patent Application No. 2016-017718, filed Feb. 2, 2016 is expressly incorporated by reference herein.

What is claimed is:

1. An oscillation module comprising:
an SAW filter; and
a high-pass filter formed in an integrated circuit,
wherein the high-pass filter has a coil part, a capacitance part, and a first interconnection adapted to connect the coil part and the capacitance part to each other, and
the capacitance part includes a capacitance array, wherein the coil part is disposed in a second wiring layer thicker than a first wiring layer in which the first interconnection is disposed.

2. The oscillation module according to claim 1, wherein the second wiring layer is stacked above the first wiring layer.

3. The oscillation module according to claim 1, wherein
the capacitance array includes a first capacitance, and
at least one electrode of the first capacitance is disposed in a first wiring layer in which the first interconnection is disposed.

4. The oscillation module according to claim 2, wherein
the capacitance array includes a first capacitance, and
at least one electrode of the first capacitance is disposed in a first wiring layer in which the first interconnection is disposed.

5. The oscillation module according to claim 3, wherein
the other electrode of the first capacitance is disposed so as to straddle a second wiring layer and a third wiring layer, and
the second wiring layer and the third wiring layer are configured so as to sandwich the first wiring layer in which the one electrode is disposed.

6. The oscillation module according to claim 4, wherein
the other electrode of the first capacitance is disposed so as to straddle a second wiring layer and a third wiring layer, and
the second wiring layer and the third wiring layer are configured so as to sandwich the first wiring layer in which the one electrode is disposed.

7. The oscillation module according to claim 5, further comprising:
a first terminal connected to the coil part; and
a second terminal connected to an outside of the high-pass filter,
wherein the first interconnection electrically connects the one electrode and the first terminal to each other, and
a second interconnection disposed in the second wiring layer and a third interconnection disposed in the third wiring layer electrically connect the other electrode and the second terminal to each other.

8. The oscillation module according to claim 3, wherein
the capacitance array further includes a second capacitance, and
one electrode of the second capacitance is connected to the one electrode of the first capacitance with the first interconnection.

9. The oscillation module according to claim 8, wherein
a capacitance value of the first capacitance and a capacitance value of the second capacitance are roughly equal to each other.

10. The oscillation module according to claim 8, wherein
a capacitance value of the second capacitance is higher than a capacitance value of the first capacitance.

11. The oscillation module according to claim 8, wherein
a wiring length of the first interconnection from the first terminal to the first capacitance is shorter than a wiring length of the first interconnection from the first terminal to the second capacitance.

12. The oscillation module according to claim 8, wherein
the capacitance array further includes a third capacitance, and
one electrode of the third capacitance is connected to the one electrode of the first capacitance and the one electrode of the second capacitance with the first interconnection.

13. An oscillation module comprising:
an SAW filter; and
a high-pass filter formed in an integrated circuit,
wherein the high-pass filter includes a coil part and a capacitance part including a capacitance array,
the capacitance array includes a first terminal connected to the coil part, a first capacitance, and a second capacitance,
a capacitance value of the first capacitance is lower than a capacitance value of the second capacitance, and
a wiring length in a case in which the first capacitance and the first terminal are connected to each other is shorter than a wiring length in a case in which the second capacitance and the first terminal are connected to each other.

14. An oscillation module comprising:
an SAW filter; and
a high-pass filter formed in an integrated circuit,
wherein the high-pass filter includes a coil part and a capacitance part including a capacitance array,
the capacitance array includes a first terminal connected to the coil part, a first array of n capacitances connected to each other, and a second array of m capacitances connected to each other,
a total capacitance value of the first array is lower than a total capacitance value of the second array, and
a wiring length in a case in which one of the capacitances belonging to the first array and the first terminal are connected to each other is shorter than a wiring length in a case in which one of the capacitances belonging to the second array and the first terminal are connected to each other.

15. The oscillation module according to claim 14, wherein n=2 and m=1.

16. An electronic apparatus comprising:
the oscillation module according to claim 1.

17. A vehicle comprising:
the oscillation module according to claim 1.

* * * * *